United States Patent
Shang et al.

(10) Patent No.: US 12,211,442 B2
(45) Date of Patent: Jan. 28, 2025

(54) DRIVING BACKPLANE, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Yi Zhang, Beijing (CN); Huijuan Yang, Beijing (CN); Tingliang Liu, Beijing (CN); Yixuan Long, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/271,043

(22) PCT Filed: May 25, 2022

(86) PCT No.: PCT/CN2022/094999
§ 371 (c)(1),
(2) Date: Jul. 6, 2023

(87) PCT Pub. No.: WO2023/225906
PCT Pub. Date: Nov. 30, 2023

(65) Prior Publication Data
US 2024/0386848 A1   Nov. 21, 2024

(51) Int. Cl.
*G09G 3/3233* (2016.01)
*H10K 59/126* (2023.01)
*H10K 59/131* (2023.01)

(52) U.S. Cl.
CPC ......... *G09G 3/3233* (2013.01); *H10K 59/126* (2023.02); *H10K 59/131* (2023.02);
(Continued)

(58) Field of Classification Search
CPC .. H10K 59/126; H10K 59/131; G09G 3/3233; G09G 3/32
See application file for complete search history.

(56) References Cited

U.S. PATENT DOCUMENTS

| 11,217,177 B2 | 1/2022 | Kim et al. |
| 2013/0140538 A1* | 6/2013 | Fujita ................... G09G 3/3233 257/40 |

(Continued)

FOREIGN PATENT DOCUMENTS

| CN | 111179828 A | 5/2020 |
| CN | 113539174 A | 10/2021 |

(Continued)

OTHER PUBLICATIONS

International Search Report issued Feb. 13, 2023 in corresponding International Patent Application No. PCT/CN2022/094999, 6 pages.
(Continued)

*Primary Examiner* — Kevin M Nguyen
(74) *Attorney, Agent, or Firm* — XSENSUS LLP

(57) ABSTRACT

A driving backplane, a display panel and a display device are provided. The driving backplane has a pixel circuit, a data line and a power line; transistors include a driving transistor, a writing transistor, a compensation transistor and an initialization transistor; the power line includes a power line body extending along a column direction and a shielding part connected to a side of the power line body along a row direction; at least a portion of the writing transistor and the initialization transistor are located between the power line and the data line; a channel of the driving transistor overlaps
(Continued)

with the power line; and a channel of the compensation transistor overlaps with the shielding part.

18 Claims, 17 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01); *G09G 2320/0257* (2013.01)

(56) References Cited

U.S. PATENT DOCUMENTS

| 2021/0183303 | A1 | 6/2021 | Kim et al. |
| 2021/0183312 | A1 | 6/2021 | Kim et al. |
| 2023/0030745 | A1 | 2/2023 | Sun et al. |
| 2023/0031984 | A1 | 2/2023 | Wang et al. |
| 2023/0360603 | A1 | 11/2023 | Wang et al. |

FOREIGN PATENT DOCUMENTS

| CN | 113707077 A | 11/2021 |
| CN | 113950715 A | 1/2022 |
| CN | 114335133 A | 4/2022 |
| CN | 114388558 A | 4/2022 |
| CN | 114495836 A | 5/2022 |
| EP | 3 839 934 A1 | 6/2021 |
| JP | 2018173646 A | 11/2018 |
| KR | 20140093157 A | 7/2014 |
| KR | 102098143 B1 | 5/2020 |
| TW | 201430810 A | 8/2014 |
| TW | I612511 B | 1/2018 |
| TW | I612511 B | 1/2018 |
| WO | 2022083348 A1 | 4/2022 |

OTHER PUBLICATIONS

Written Opinion of the International Searching Authority issued Feb. 13, 2023 in corresponding International Patent Application No. PCT/CN2022/094999, 3 pages.

* cited by examiner

DRIVING BACKPLANE, DISPLAY PANEL AND DISPLAY DEVICE

CROSS REFERENCE TO RELATED APPLICATION

The present disclosure is the U.S. national phase application of International Application No. PCT/CN2022/094999 filed on May 25, 2022, the content of which is incorporated herein by reference in its entirety for all purposes.

TECHNICAL FIELD

The present disclosure relates to the field of display technology, in particular to a driving backplane, a display panel and a display device.

BACKGROUND

An OLED (organic light-emitting diode) display panel has advantages of self-illumination, wide color gamut, high contrast ratio, flexibleness, and high response flexibility, etc., and has wide application prospects.

It should be noted that the information disclosed in above section is only for the purpose of enhancing the understanding of the background of the present disclosure, and thus may include information that does not constitute prior art known to those of ordinary skill in the art.

SUMMARY

The present disclosure provides a driving backplane, a display panel, and a display device.

According to one aspect of the present disclosure, there is provided a driving backplane having a pixel circuit, and a data line and a power line connected to the pixel circuit, wherein the pixel circuit includes multiple transistors having a control terminal and two signal terminals, the transistors includes at least a driving transistor, a writing transistor, a compensation transistor and an initialization transistor, one of the signal terminals of the driving transistor is connected to the power line, the other of the signal terminals of the driving transistor is connected to a light-emitting device, one of the signal terminals of the driving transistor is connected to the control terminal of the driving transistor through the compensation transistor, and the initialization transistor and the writing transistor are connected to the driving transistor at one same signal terminal different from a signal terminal at which the compensation transistor is connected to the driving transistor; wherein the driving backplane includes: a substrate; and a circuit layer arranged on a side of the substrate and including the pixel circuitry, the data line and the power line, wherein the data line and the power line are arranged on a side of the pixel circuitry away from the substrate, the data line and the power line extend along a column direction, and the power line includes a power line body extending along the column direction and a shielding part connected to a side of the power line body along a row direction; wherein at least a portion of the writing transistor and the initialization transistor are located between the power line and the data line, at least a portion of a channel of the driving transistor overlaps with the power line, and at least a portion of a channel of the compensation transistor overlaps with the shielding part.

In some embodiments of the present disclosure, the compensation transistor and the driving transistor are arranged along the column direction, and the driving transistor is located between the compensation transistor and the initialization transistor; the compensation transistor includes a first channel, a second channel and an active connection part connecting the first channel and the second channel, the first channel is located on a side of the second channel away from the driving transistor and is located on a side of the second channel close to the data line, and the shielding part overlaps with at least a portion of the first channel.

In some embodiments of the present disclosure, the power line body is located on a side of the shielding part away from the data line, and the power line body overlaps with at least a portion of the second channel.

In some embodiments of the present disclosure, the pixel circuit further includes a storage capacitor located between the second channel and the initialization transistor, the storage capacitor is connected to the power line and the control terminal of the driving transistor, and the storage capacitor overlaps with at least a portion of the channel of the driving transistor; the active connection part includes a first connection section extending along the column direction, a second connection section extending along the row direction and a protrusion part, one end of the first connection section is connected to the first channel, the other end of the first connection section is connected to one end of the second connection section, the other end of the second connection section is connected to the second channel, the first connection section and the first channel have the same width along the row direction, and the second connection section and the second channel have the same width along the column direction; the protrusion part extends from the second connection section away from the first connection section along a direction away from the first connection section, and at least a portion of the first connection section, the second connection section and the protrusion part all overlap with the storage capacitor.

In some embodiments of the present disclosure, the storage capacitor includes a first plate and a second plate arranged along a direction away from the substrate, the first plate is repeatedly used as the control terminal of the driving transistor, and the second plate overlaps with at least a portion of the first connection section, the second connection section and the protrusion part.

In some embodiments of the present disclosure, the second plate includes a plate body and an extension part, the plate body overlaps with the first plate, the plate body is located between the second channel and the driving transistor, the extension part extends from an edge of the plate body along a direction away from the driving transistor, and the extension part overlaps with at least a portion of the first connection section, the second connection section and the protrusion part.

In some embodiments of the present disclosure, the circuit layer further includes an initialization control line, an initialization signal line, a reset control line, a first reset signal line, a second reset signal line, a first scan line, a second scan line, and a light-emitting control line, and the pixel circuit further includes a first light-emitting control transistor, a second light-emitting control transistor, a first reset transistor and a second reset transistor; the power line is connected to one of the signal terminals of the driving transistor through the first light-emitting control transistor, the second reset transistor and the light-emitting device are connected to the driving transistor through the second light-emitting control transistor, and control terminals of the first light-emitting control transistor and the second light-emitting control transistor are both connected to the light-emitting control line; the initialization signal line is connected to one of the signal terminals of the driving transistor through the initialization transistor, and control terminals of the initialization transistor and the second reset transistor are both connected to the initialization control line; the first reset signal line is connected to the control terminal of the driving transistor through the first reset transistor, the reset control line is connected to a control terminal of the first reset transistor, the second reset signal line is connected to the second light-emitting control transistor and the light-emitting device through the second reset transistor, the first scan line is connected to a control terminal of the writing transistor, and the second scan line is connected to a control terminal of the compensation transistor.

In some embodiments of the present disclosure, the first scan line includes a first scan line body and a transfer connection part insulatedly arranged along a direction away from the substrate, and the transfer connection part connects the first scan line body to the control terminal of the writing transistor.

In some embodiments of the present disclosure, the power line body overlaps with at least a portion of a channel of the first reset transistor, at least a portion of the channel of the driving transistor, and at least a portion of a channel of the first light-emitting control transistor.

In some embodiments of the present disclosure, the circuit layer includes: a semiconductor layer arranged on a side of the substrate and including channels of the transistors; a first gate insulating layer covering the semiconductor layer; a first gate layer arranged on a surface of the first gate insulating layer away from the substrate and including the initialization control line, the light-emitting control line, the reset control line, the second scan line, the transfer connection part and the first plate; a second gate insulating layer covering the first gate layer; a second gate layer arranged on a surface of the second gate insulating layer away from the substrate and including the initialization signal line, the first reset signal line and the second plate; a dielectric layer covering the second gate layer; a first source and drain layer arranged on a surface of the dielectric layer away from the substrate and including the first scan line body and the second reset signal line; a first flat layer arranged on a side of the first source and drain layer away from the substrate; and a second source and drain layer arranged on a surface of the first flat layer away from the substrate and including the power line and the data line.

In some embodiments of the present disclosure, the semiconductor layer includes a first active part to an eighth active part, the first active part, a second active part and a third active part are arranged along the column direction and are connected in sequence, a fourth active part is connected to a side of the third active part close to the second active part, the fourth active part and the second active part are arranged along the row direction, a fifth active part and a sixth active part are connected on a side of of the third active part away from the second active part, the fifth active part and the sixth active part are arranged along the row direction, a seventh active part is connected to an end of the sixth active part away from the third active part, the eighth active part and the fourth active part are arranged along the column direction, and the eighth active part and the seventh active part are arranged along the row direction; the first active part includes a channel of the first reset transistor, the reset control line extends along the row direction and overlaps with the channel of the first reset transistor, and the first reset signal line extends along the row direction and overlaps with the first active part; the second active part includes the first channel, the second channel and the active connection part, the second scan line includes a second scan line body extending along the row direction and an overlapping part connected to a side of the second scan line body, the second scan line body overlaps with the first channel, and the overlapping part overlaps with the second channel; the third active part includes the channel of the driving transistor; the fourth active part includes a channel of the writing transistor, and the transfer connection part overlaps with the channel of the writing transistor; the fifth active part includes a channel of the first light-emitting control transistor, the sixth active part includes a channel of the second light-emitting control transistor, the light-emitting control line extends along the row direction and overlaps with the channels of the first light-emitting control transistor and the second light-emitting control transistor; the seventh active part includes a channel of the second reset transistor, the eighth active part includes a channel of the initialization transistor, the initialization control line extends along the row direction and overlaps with the channels of the second reset transistor and the initialization transistor, the initialization signal line and the second reset signal line both extend along the row direction, and both overlap with the seventh active part and the eighth active part.

In some embodiments of the present disclosure, the first scan line body is located on a side of the second scan line body away from the driving transistor; the second active part includes a first active section extending along the column direction and a second active section extending along the row direction, the active connection part connects the first active section to the second active section, the first channel is located in the first active section, and the second channel is located in the second active section; the first scan line body has a bending area bent along a direction away from the driving transistor, and one end of the first active section extends to a side of the second scan line body away from the driving transistor; an orthographic projection of the end of the first active section extending to the side of the second scan line body away from the driving transistor on the substrate extends into an orthographic projection of the bending area on the substrate; the first source and drain layer further includes a first connection line, one end of the first connection line is connected to the end of the first active section located within the bending area, and the other end of the first connection line passes through a through hole in the second plate and is connected to the first plate.

In some embodiments of the present disclosure, the eighth active part extends along the column direction, and both ends of the eighth active part extend to both sides of the initialization control line, the first source and drain layer further includes a second connection line, one end of the second connection line is connected to an end of the eighth active part located where the initialization control line is close to the driving transistor, and the other end of the second connection line is connected to the third active part and the fourth active part.

In some embodiments of the present disclosure, the second connection line extends along the column direction, the channel of the writing transistor, the channel of the initialization transistor, and the second connection line are arranged along the column direction, and an orthographic projection of the second connection line on the substrate and an orthographic projection of the data line on the substrate are distributed in a spaced manner.

According to one aspect of the present disclosure, there is provided a display panel including: the driving backplane as described in any of above embodiments; a light-emitting device arranged on a side of the circuit layer away from the substrate and connected to the pixel circuit.

According to one aspect of the present disclosure, there is provided a display device including a display panel as described in any of above embodiments.

It should be understood that the general description above and the detailed description in the following are only illustrative and explanatory, and do not limit the present disclosure.

BRIEF DESCRIPTION OF THE DRAWINGS

The drawings herein, which are incorporated in and constitute a portion of this specification, illustrate embodiments consistent with the present disclosure and serve together with the specification to explain principles of the present disclosure. It is apparent that the drawings in the following description are only some embodiments of the present disclosure, and other drawings can be obtained based on the drawings by those of ordinary skill in the art without creative effort.

DETAILED DESCRIPTION

Figure 1:
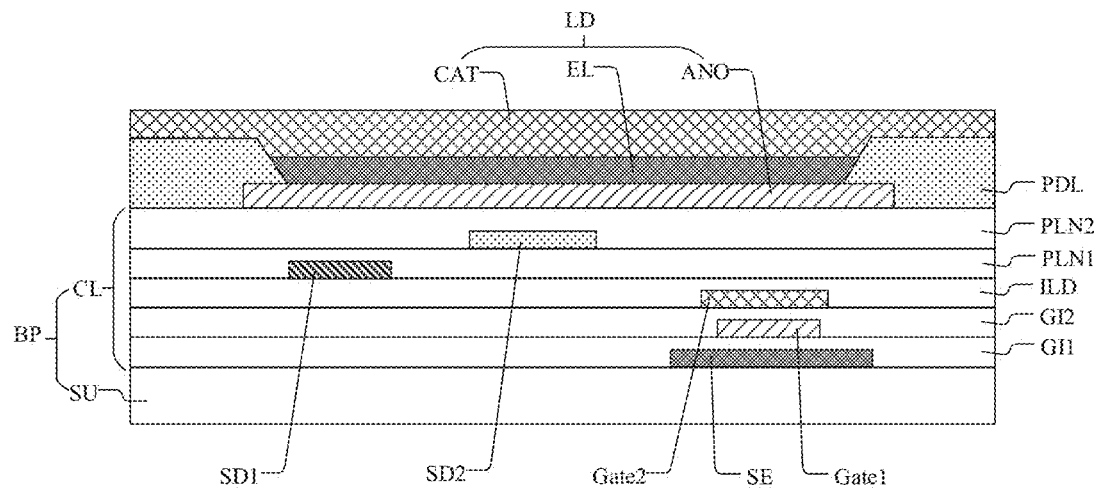
FIG. 1 is a cross-sectional schematic diagram of a display panel according to embodiments of the present disclosure.

Example embodiments will now be described more fully with reference to the drawings. However, the example embodiments can be implemented in a variety of forms and should not be construed as being limited to the embodiments set forth herein. Rather, the provision of these embodiments makes the present disclosure comprehensive and complete and conveys ideas of the example embodiments in a comprehensive manner to those skilled in the art. The same reference numerals in the drawings indicate the same or similar structures, and thus their detailed description will be omitted. In addition, the drawings are only schematic illustrations of the present disclosure and are not necessarily drawn to scale.

Although relative terms such as "upper" and "lower" are used in this specification to describe a relative relationship of one component and another component, these terms are used in this specification only for convenience, for example, according to a direction of the example shown in the drawings. It will be appreciated that if the device illustrated is turned upside down, the component described as "upper" will become the "lower" component. When a certain structure is "on" another structure, it may mean that the certain structure is integrally formed on the other structure, or it may mean that the certain structure is "directly" arranged on the other structure, or that the certain structure is "indirectly" arranged on the other structure through yet another structure.

Terms "a", "an", "the", "said" and "at least one" are used to indicate presence of one or more elements/components/etc. Terms "include" and "comprise" are used to indicate an open-ended inclusion, and mean presence of additional elements/components/etc., in addition to listed elements/components/etc. Terms "first", "second", "third", etc., are used as markings only, instead of limiting the number of objects.

A row direction X and a column direction Y herein are only two mutually perpendicular directions. In the drawings of the present disclosure, the row direction X can be horizontal, and the column direction Y can be vertical, but they are not limited to this. Actual orientations of the row direction X and the column direction Y may change if the display panel is rotated.

The "overlap" of features A and B herein means that an orthographic projection of the feature A on the substrate at least partially overlaps with an orthographic projection of the feature B on the substrate. The "not overlap" of features A and B herein means that an area where the orthographic projection of the feature A on the substrate overlaps with the orthographic projection of the feature B on the substrate is zero.

A transistor in a pixel circuit of the present disclosure can be an N-type transistor, a P-type transistor, or both. The transistor can have a control terminal and two signal terminals. The transistor can be controlled to be turned on and to be turned off through the control terminal. Two signal terminals can be used for input and output signals, one of the two signal terminals can be a first signal terminal, and the other can be a second signal terminal. One of the two signal terminals can be a source of the transistor, the other can be a drain of the transistor, and the control terminal can be a gate of the transistor. The source and the drain of the transistor can be interchanged. When an operating state of the transistor is changed, for example, when a current direction is changed, the source and the drain of the transistor can be interchanged.

As shown in FIG. 1, a display panel of the present disclosure can include a driving backplane BP and a light-emitting device LD provided on a side of the driving backplane BP. A driving circuit in the driving backplane BP can drive the light-emitting device LD to emit light to display an image.

The light-emitting device LD can be an organic light-emitting diode (OLED) having a first electrode ANO, a second electrode CAT, and a light-emitting layer EL located between the first electrode ANO and the second electrode CAT. The display panel can be divided into at least a display area and a peripheral area outside the display area, and the driving circuit can include a pixel circuit located in the display area and a peripheral circuit located in the peripheral area. The peripheral circuit can be connected to the light-emitting device LD through the pixel circuit and apply a first power supply signal VDD to the first electrode ANO of the light-emitting device LD on the one hand, and on the other hand, the peripheral circuit can also be connected to the second electrode CAT of the light-emitting device LD and apply a second power supply signal VSS to the second electrode CAT of the light-emitting device LD. The current through the light-emitting device LD can be controlled by controlling the pixel circuit, so as to control the brightness of the light-emitting device LD.

Figure 2:
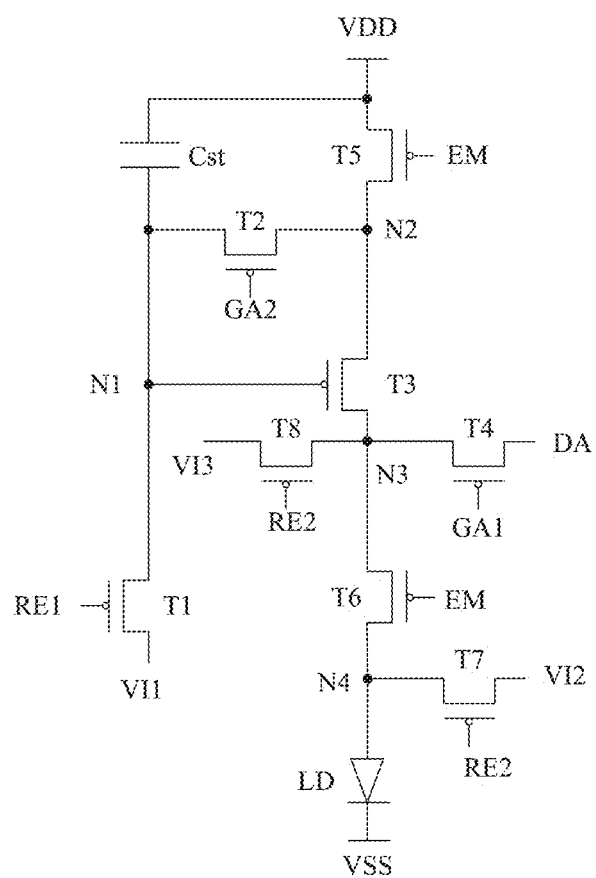
FIG. 2 is an equivalent circuit diagram of a first type of a pixel circuit of a driving backplane according to embodiments of the present disclosure.
Figure 5:
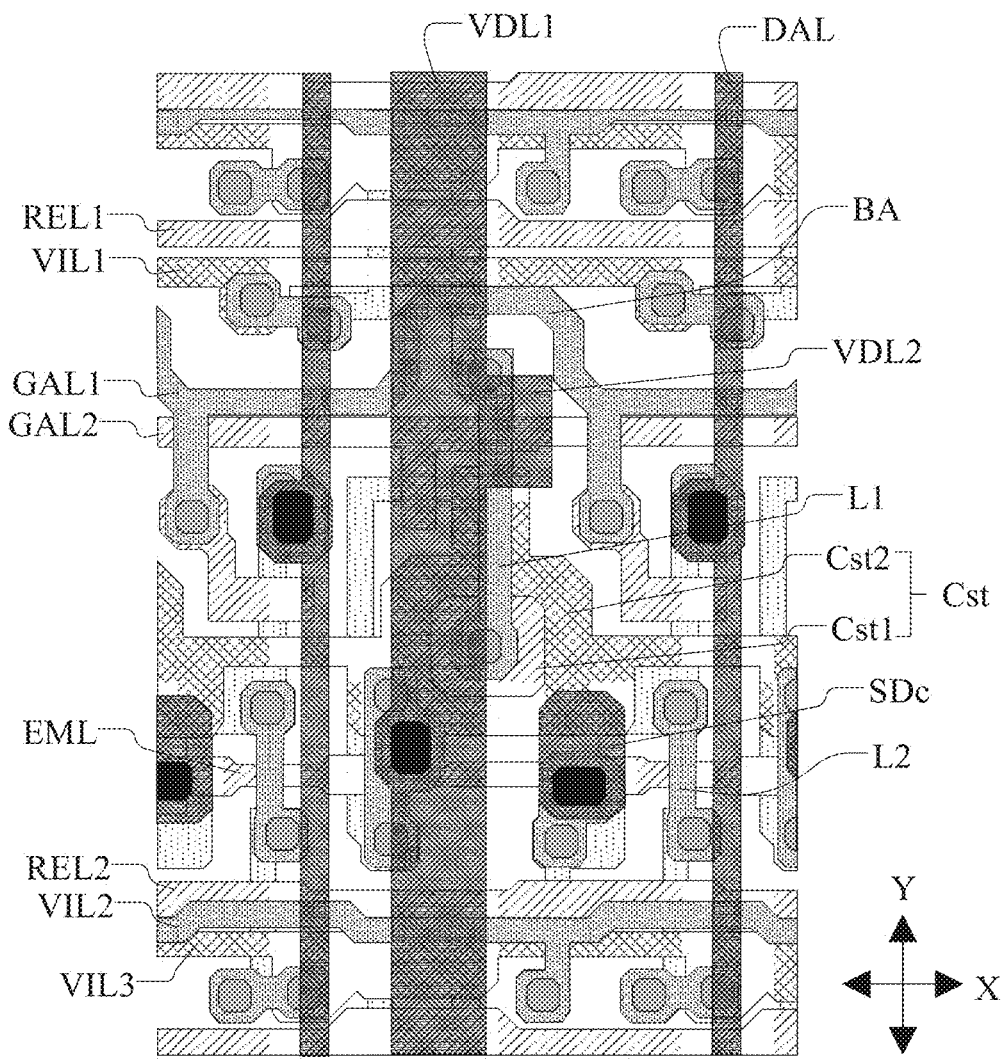
FIG. 5 is a partial top view of a first implementation of a driving backplane according to embodiments of the present disclosure.

As shown in FIGS. 1, 2 and 5, the driving backplane of the present disclosure can include a substrate SU and a circuit layer CL provided on a side of the substrate SU. The substrate SU can be a flexible transparent material such as polyimide or a rigid transparent material such as glass. The circuit layer CL can include a pixel circuit, and a data line DAL and a power line VDL connected to the pixel circuit. The number of the pixel circuit can be multiple and can be arranged in an array in multiple rows and multiple columns. The number of the data line DAL and the power line VDL can also be multiple, and can extend along a column direction Y. One data line DAL can be connected to at least one column of pixel circuits, and the same power line VDL can also be connected to at least one column of pixel circuits. The data line DAL can input a data signal to the pixel circuit, and the power line VDL can input a first power supply signal VDD to the pixel circuit.

For convenience of description, only one pixel circuit and the data line DAL and the power line VDL connected thereto are taken as an example for illustration herein, and other pixel circuits can be referred to implementations in the present disclosure, which will not be repeated herein.

In some embodiments, basic principles of the pixel circuit are explained in conjunction with an equivalent circuit diagram of the pixel circuit.

The pixel circuit can include multiple transistors, and can also include a capacitor. The pixel circuit can be a 3T1C pixel circuit, a 7T1C pixel circuit, etc. The nTmC indicates that a pixel circuit includes n transistors (denoted by a letter "T") and m capacitors (denoted by a letter "C").

In some embodiments of the present disclosure, the pixel circuit can include a driving transistor T3, a compensation transistor T2, and a writing transistor T4.

In some embodiments, a signal terminal of the driving transistor T3 is connected to the power line VDL and the other signal terminal is connected to the light-emitting device LD. A signal terminal and a control terminal of the driving transistor T3 are connected through the compensation transistor T2. The data line DAL can be connected to a signal terminal of the driving transistor T3 through the writing transistor T4, and the writing transistor T4 and the compensation transistor T2 are connected to different signal terminals of the driving transistor T3. The writing transistor T4 and the compensation transistor T2 are connected to different signal terminals of the driving transistor T3. A data signal DA can be written to the control terminal of the driving transistor T3 through the data line DAL and the writing transistor T4, to control pressure difference between the control terminal and the signal terminal thereof, so as to control a current passing through the driving transistor T3 and control the brightness of the light-emitting device LD.

Figure 6:
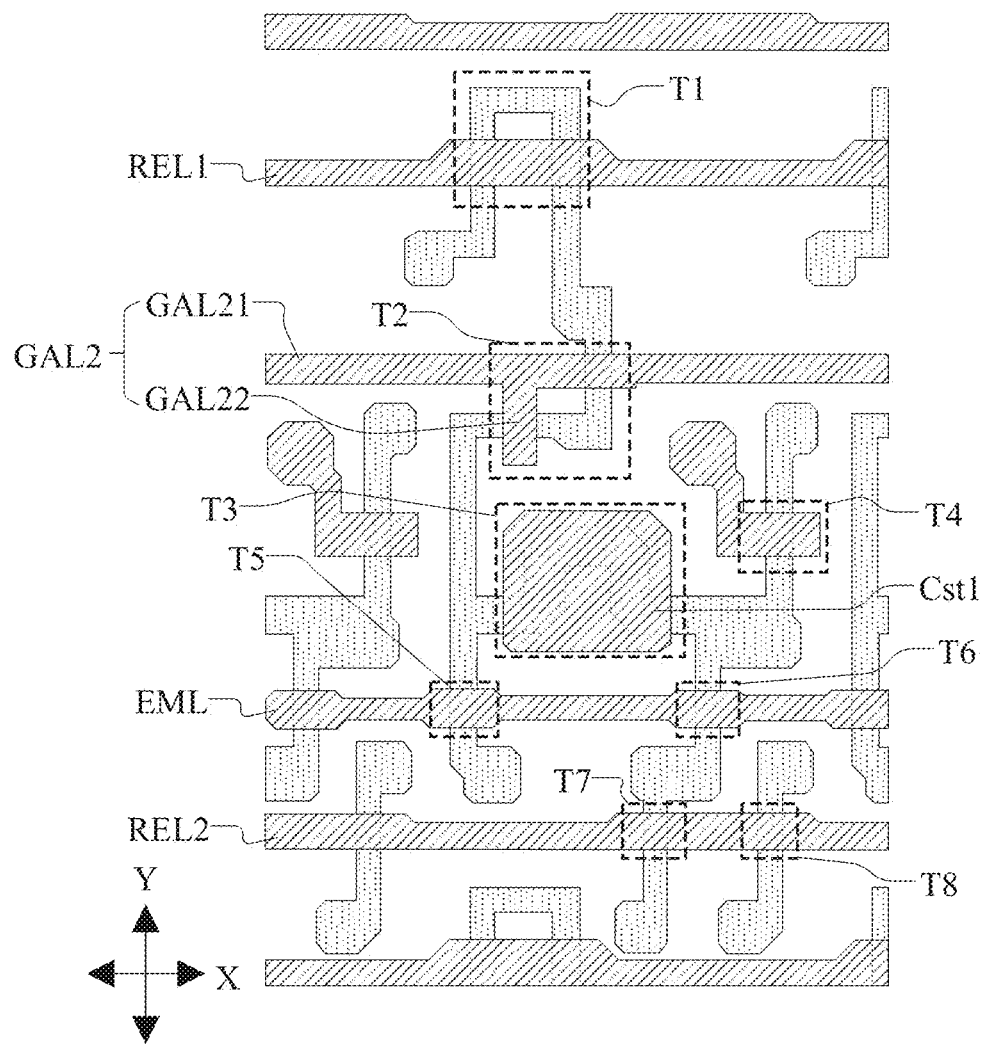
FIG. 6 is a partial top view of a semiconductor layer and a first gate layer in FIG. 5.

According to above embodiments, as shown in FIGS. 2, 5 and 6, in some embodiments of the present disclosure, the pixel circuit can further include a first light-emitting control transistor T5, a second light-emitting control transistor T6, a first reset transistor T1, a second reset transistor T7, and a storage capacitor Cst, thereby forming a pixel circuit of the 7T1C structure. In some embodiments, accordingly, the circuit layer CL can further include an initialization control line REL2, a reset control line REL1, a first reset signal line VIL1, a second reset signal line VIL2, a first scan line GAL1, a second scan line GAL2, and a light-emitting control line EML.

In some embodiments, the power line VDL and a signal terminal of the driving transistor T3 are connected through the first light-emitting control transistor T5, and the second reset transistor T7 and light-emitting device LD are connected to the other signal terminal of the driving transistor T3 through the second light-emitting control transistor T6. Control terminals of both the first light-emitting control transistor T5 and the second light-emitting control transistor T6 are connected to the light-emitting control line EML. A control terminal of the second reset transistor T7 is connected to the initialization control line REL2. The first reset signal line VIL1 is connected to the control terminal of the driving transistor T3 through the first reset transistor T1, and the reset control line REL1 is connected to a control terminal of the first reset transistor T1. The second reset signal line VIL2 is connected to the second light-emitting control transistor T6 and the light-emitting device LD through the second reset transistor T7. The first scan line GAL1 is connected to a control terminal of the writing transistor T4, and the second scan line GAL2 is connected to a control terminal of the compensation transistor T2.

The above reset control line REL1 is used to transmit a reset control signal, for controlling the turning-on and the turning-off of the first reset transistor T1. The initialization control line REL2 is used to transmit an initialization control signal, for controlling the turning-on and the turning-off of the second reset transistor T7. The first scan line GAL1 is used to transmit a first scan signal GA1, for controlling the turning-on and the turning-off of the writing transistor T4. The second scan line GAL2 is used to transmit a second scan signal GA2, for controlling the turning-on and the turning-off of the compensation transistor T2. The light-emitting control line EML is used to transmit a light-emitting control signal, for controlling the turning-on and the turning-off of the first light-emitting control transistor T5 and the second light-emitting control transistor T6. The first reset signal line VIL1 is used to transmit a first reset signal VI1, and the second reset signal line VIL2 is used to transmit a second reset signal VI2. The storage capacitor Cst is connected to the power line VDL and the control terminal of the driving transistor T3.

In some embodiments, based on the 7T1C pixel circuit described above, as shown in FIGS. 2, 5 and 6, in a first type of pixel circuit, a first signal terminal of the first light-emitting control transistor T5 is connected to the power line VDL, a second signal terminal of the first light-emitting control transistor T5 is connected to a first signal terminal of the driving transistor T3, and a control terminal of the first light-emitting control transistor T5 is connected to the light-emitting control line EML. A first signal terminal of the second light-emitting control transistor T6 is connected to a second signal terminal of the driving transistor T3, and a second signal terminal of the second light-emitting control transistor T6 is connected to the first electrode ANO of the light-emitting device LD.

A first signal terminal of the writing transistor T4 is connected to the data line DAL, and a second signal terminal of the writing transistor T4 is connected to the second signal terminal of the driving transistor T3.

A first signal terminal of the compensation transistor T2 is connected to the first signal terminal of the driving transistor T3, and a second signal terminal of the compensation transistor T2 is connected to the control terminal of the driving transistor T3.

A first signal terminal of the first reset transistor T1 is connected to the first reset signal line VIL1, and a second signal terminal of the first reset transistor T1 is connected to the control terminal of the driving transistor T3.

A first signal terminal of the second reset transistor T7 is connected to the second reset data line DAL, and a second signal terminal of the second reset transistor T7 is connected to the second signal terminal of the second light-emitting control transistor T6.

A first plate Cst1 of the storage capacitor Cst is connected to the power line VDL, and a second plate Cst2 of the storage capacitor Cst is connected to the control terminal of the driving transistor T3.

The working principle of the first type of pixel circuit is explained in the following.

Each transistor of the pixel circuit can be a P-type low-temperature polysilicon transistor. The P-type low-temperature polysilicon transistor has a high carrier mobility, thus facilitating realization of a display panel with high resolution, high response speed, high pixel density, and high aperture ratio. The P-type low-temperature polysilicon transistor can be turned off when a high level is applied to a control terminal thereof, and can be turned on when a low level signal is applied. In some embodiments, the transistor can also be an N-type low-temperature polysilicon transistor, which can be turned on when a high level signal is applied.

Only the P-type low-temperature polysilicon transistor is taken as an example for illustration herein.

Figure 3:
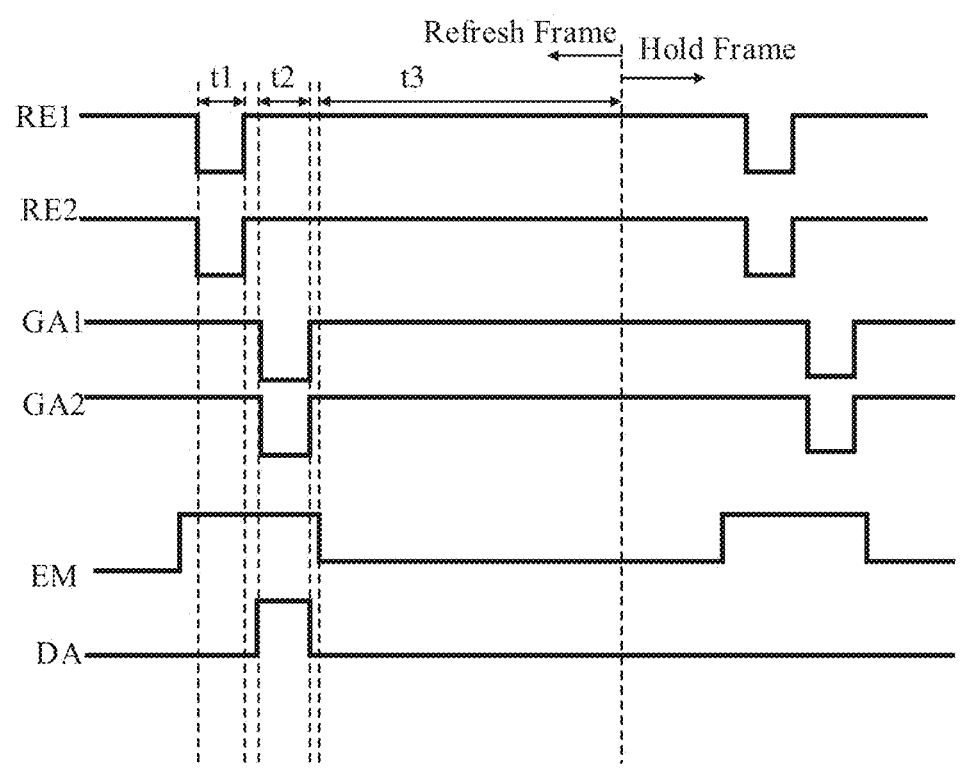
FIG. 3 is a timing diagram of a first type of a pixel circuit of a driving backplane according to embodiments of the present disclosure.

As shown in FIG. 3, in a reset phase t1, the reset control signal outputted by the reset control line REL1 is a low-level signal, the first reset transistor T1 is turned on, and the first reset signal line VIL1 inputs the first reset signal Vii to the control terminal of the driving transistor T3 and the first plate Cst1 of the storage capacitor Cst. At the same time, the first reset signal outputted by the reset control line REL1 is a low-level control signal, the second reset transistor T7 is turned on, and the second reset signal line VIL2 inputs the second reset signal VI2 to the first electrode ANO of the driving light-emitting device LD and the second signal terminal of the second light-emitting control transistor T6, so that a node N1 and a node N4 can be reset.

In a write phase t2, the writing transistor T4 and the compensation transistor T2 are turned on, and a data signal DA is written to the control terminal of the driving transistor T3 and the first plate Cst1 of the storage capacitor Cst. That is, the data signal DA is written to node N1 node through node N3 and node N2, driving starts when a potential reaches Vdata+vth. The first scan signal GA1 outputted by the first scan line GAL1 is a low-level signal, and the second scan signal GA2 outputted by the second scan line GAL2 is a low-level signal, and the writing transistor T4 and the compensation transistor T2 are turned on. At the same time, the data line DAL outputs a data signal, to write a voltage Vdata+Vth to node N1, where Vdata is a voltage of the data signal Da, and Vth is a threshold voltage of the driving transistor T3. The first scan signal GA1 and the second scan signal GA2 can be the same signal, the first scan line GAL1 and the second scan signal GAL2 can be connected, and at the same time, the first scan signal GA1 and the second scan signal GA2 can be high frequency signals, which is conducive to reducing the load of a source signal of the driving transistor T3.

In a light-emitting phase t3, the light-emitting control signal outputted by the light-emitting control line EML is a low-level signal, and the first light-emitting control transistor T5 and the second light-emitting control transistor T6 are turned on. The driving transistor T3 is turned on under the action of the voltage Vdata+Vth stored in the storage capacitor Cst and the first power supply signal VDD outputted by the power line VDL. The light-emitting device LD emits light under the action of the first power signal VDD and the second power signal VSS. In this process, the first signal terminal of the driving transistor T3 acts as the source, the second signal terminal acts as the drain, and the control terminal acts as the gate.

The current at the output of the driving transistor T3 satisfies the following equation:

$$I=(\mu W Cox/2L)(Vgs-Vth)^2,$$

where I is the output current of the driving transistor T3, $\mu$ is the carrier mobility, Cox is the gate capacitance per unit area. W is a width of the channel of the driving transistor T3, L is a length of the channel of the driving transistor T3, Vgs is the gate-source voltage difference of the driving transistor T3, and Vth is the threshold voltage of the driving transistor T3.

According to above formula of the output current of the driving transistor T3, the gate voltage Vdata+Vth and the source voltage Vdd of the driving transistor T3 in the pixel circuit of the present disclosure are brought into the above formula, so as to obtain the output current $I=(\mu W Cox/2L)(Vdata+Vth-Vdd-Vth)^2$ of the driving transistor T3. It can be seen that the output current of the pixel circuit is independent of the threshold voltage Vth of the driving transistor T3, but only related to Vdata. As a result, the impact of the threshold voltage of the driving transistor T3 on the output current thereof can be thus eliminated, and the control of the output current can be achieved through Vdata only, so as to control the brightness of the light-emitting device LD.

Figure 4:
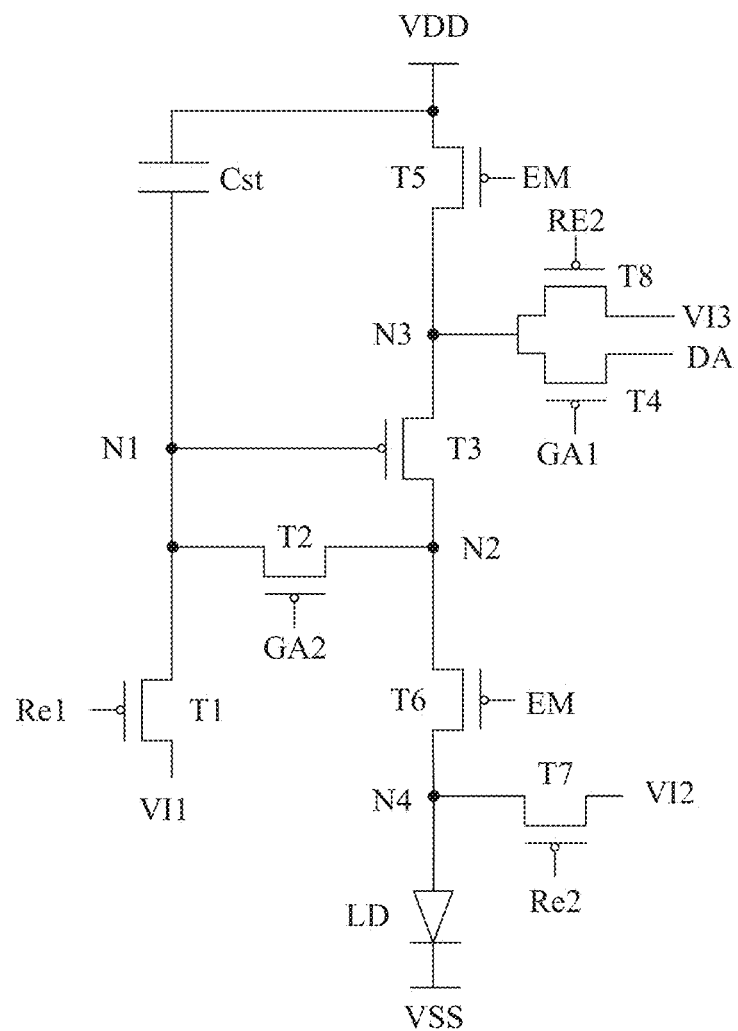
FIG. 4 is an equivalent circuit diagram of a second type of a pixel circuit of a driving backplane according to embodiments of the present disclosure.

Based on the first type of pixel circuit mentioned above, a second type of pixel circuit can be obtained by changing the connection of the compensation transistor T2 and the writing transistor T4, as shown in FIG. 4. The first signal terminal of the compensation transistor T2 is connected to the second signal terminal of the driving transistor T3, and the second signal terminal of the compensation transistor T2 is connected to the control terminal of the driving transistor T3. The second terminal of the writing transistor T4 can be connected to the first signal terminal of the driving transistor T3. The connections of other transistors can be referred to the implementations above and will not be described in detail herein.

However, when switching between black and white screens, the brightness of the first frame would be abnormal. i.e., the display panel will have residual images. After extensive experiments and analysis, the inventor found that when different gate-source voltage differences are applied to the driving transistor T3, the number of majority carriers captured at the channel interface of the driving transistor T3 is different, resulting in a hysteresis effect, thereby leading to different driving currents of the driving transistor T3. A size of the driving current generated by the driving transistor T3 is directly related to the brightness of the light-emitting device. The gate-source voltage difference of the driving transistor T3 is different under different display gray levels, resulting in difference in brightness. The residual images will occur when different gray levels are converted to the same gray level.

In order to solve the problem of the residual image caused by the hysteresis effect of the driving transistor T3, the present disclosure provides a new pixel circuit based on the driving circuit mentioned above, as shown in FIGS. 2 and 4. The pixel circuit can further include an initialization transistor T8, in addition to the pixel circuit of any of above implementations, thus a pixel circuit of 8T1C structure will be obtained. The initialization transistor T8 and the writing transistor T4 are connected to the same signal terminal of the driving transistor T3, and are connected to different signal terminals of the compensation transistor T2. The initialization transistor T8 can be connected to the initialization signal line VIL3, for inputting the initialization signal VI3 to the driving transistor T3.

In some embodiments, based on above first type of pixel circuit, as shown in FIGS. 2, 5 and 6, the compensation transistor T2 can be connected to the control terminal and the first signal terminal of the driving transistor T3. A first signal terminal of the initialization transistor T8 is connected to the initialization signal line VIL3, and a second signal terminal of the initialization transistor T8 is connected to the second signal terminal of the writing transistor T4 at the second signal terminal of the driving transistor T3.

Figure 13:
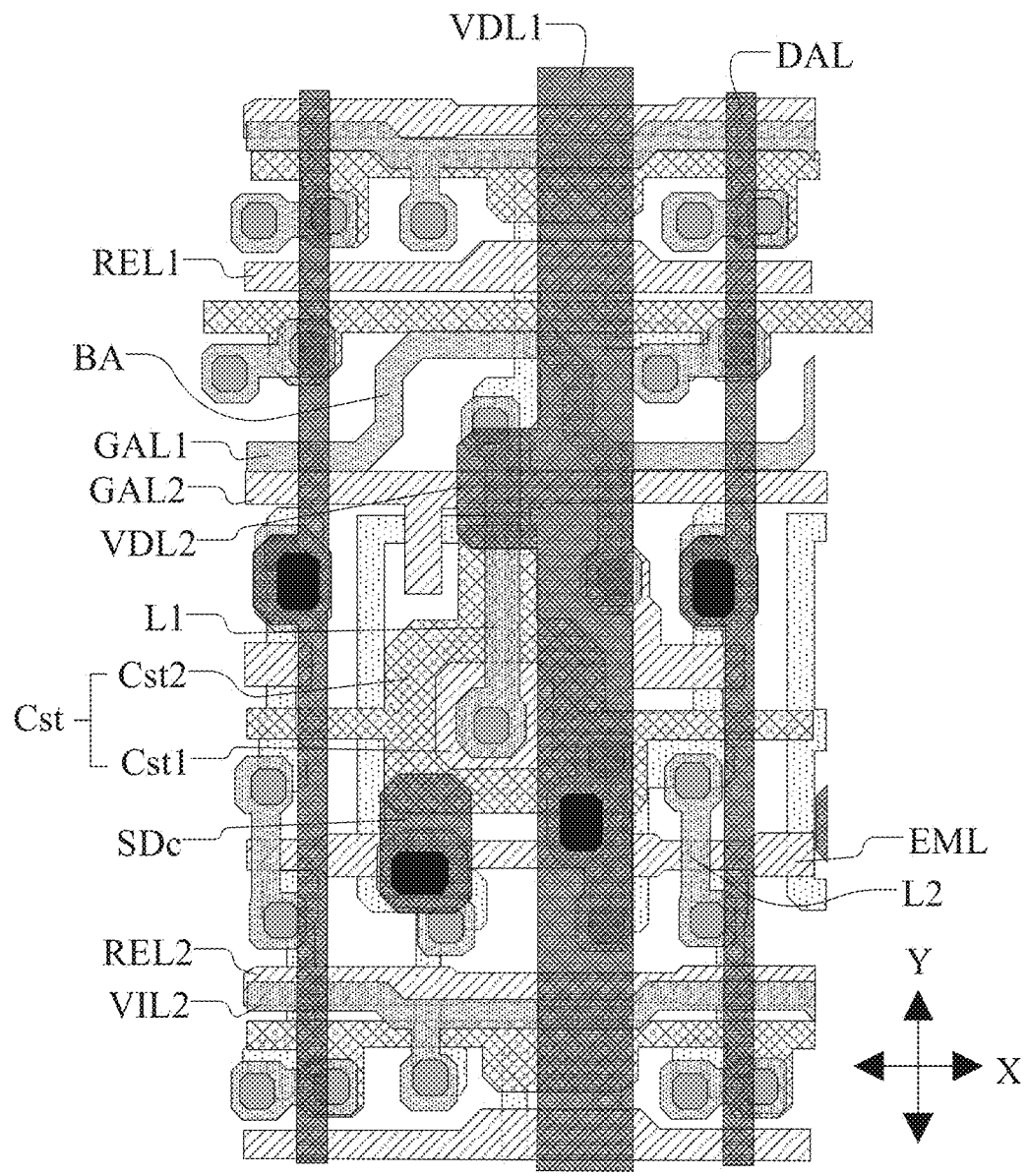
FIG. 13 is a partial top view of a second implementation of a driving backplane according to embodiments of the present disclosure.
Figure 14:
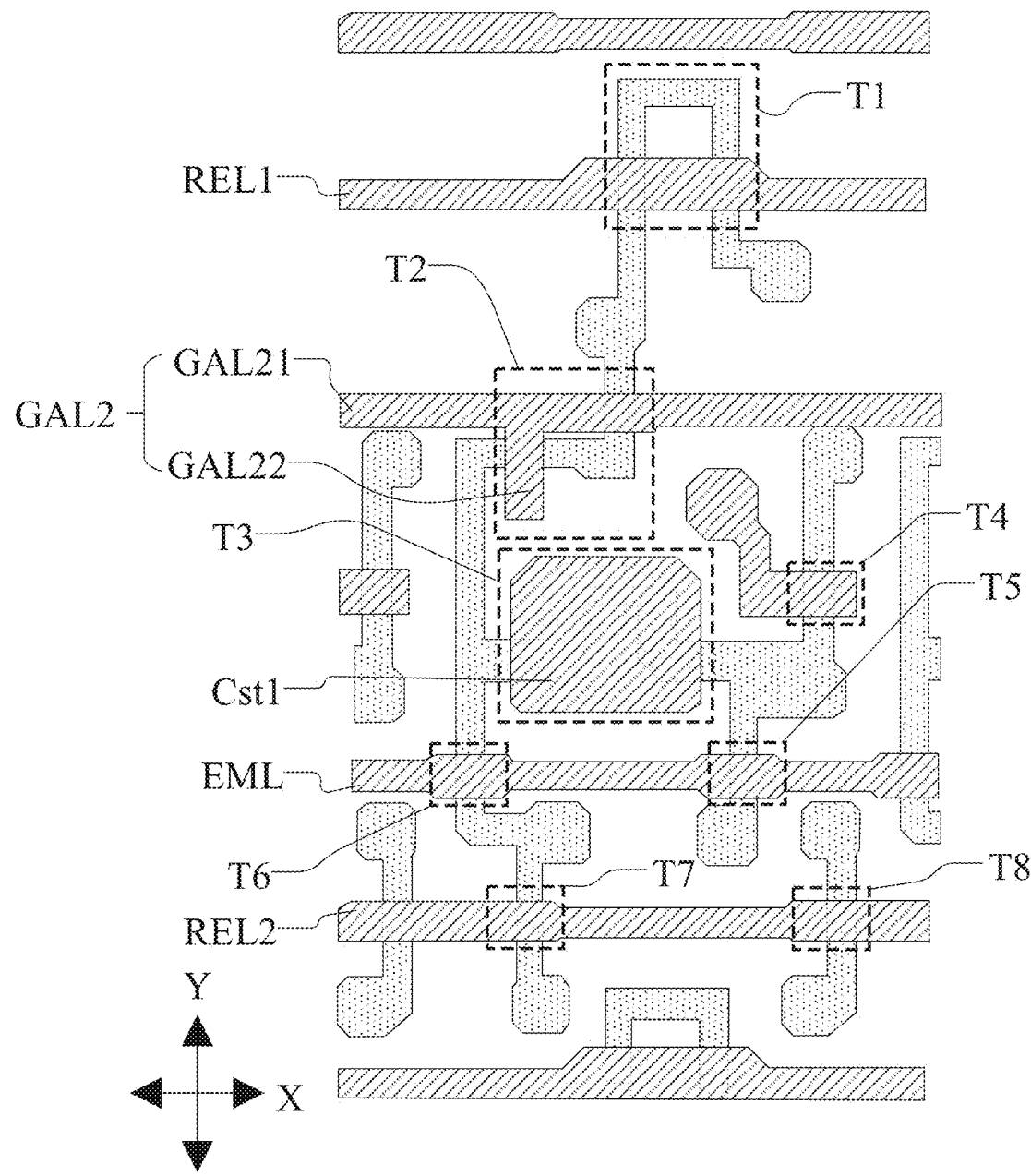
FIG. 14 is a partial top view of a semiconductor layer and a first gate layer in FIG. 13.
Figure 15:
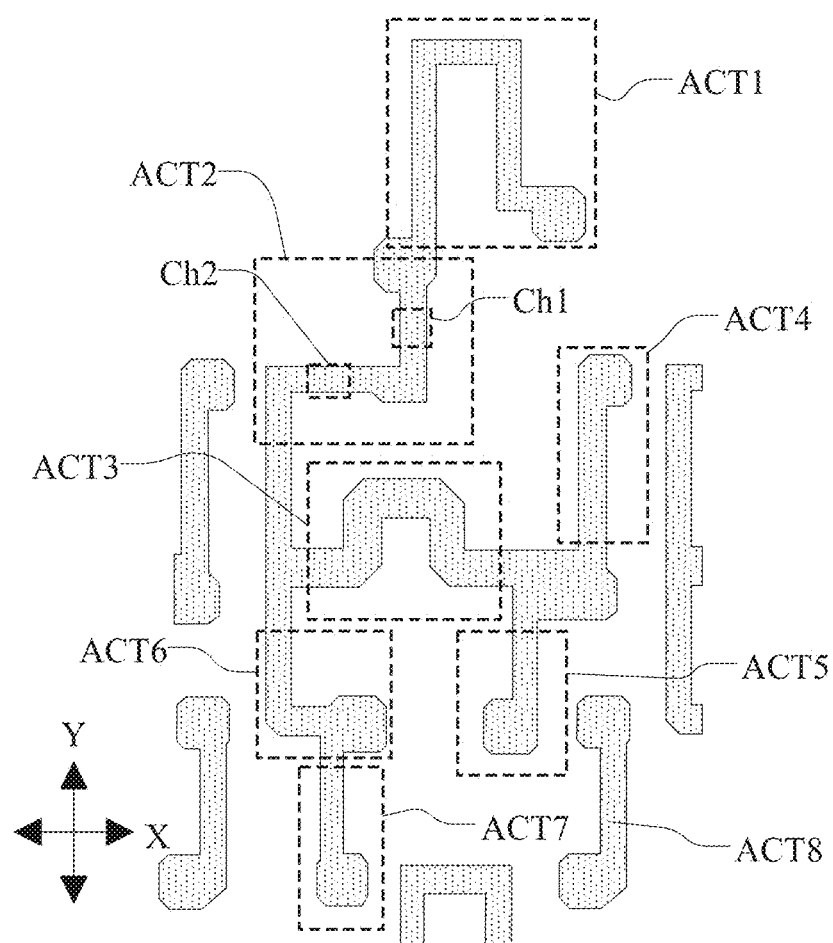
FIG. 15 is a partial top view of a semiconductor layer in FIG. 13.
Figure 16:
FIG. 16 is a partial top view of a first gate layer in FIG. 13.
Figure 16:
Figure 16:
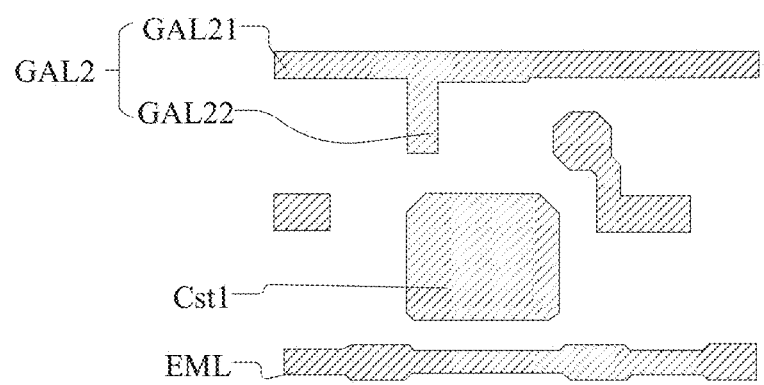
Figure 16:
Figure 16:
Figure 16:
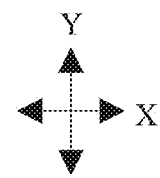
Figure 17:
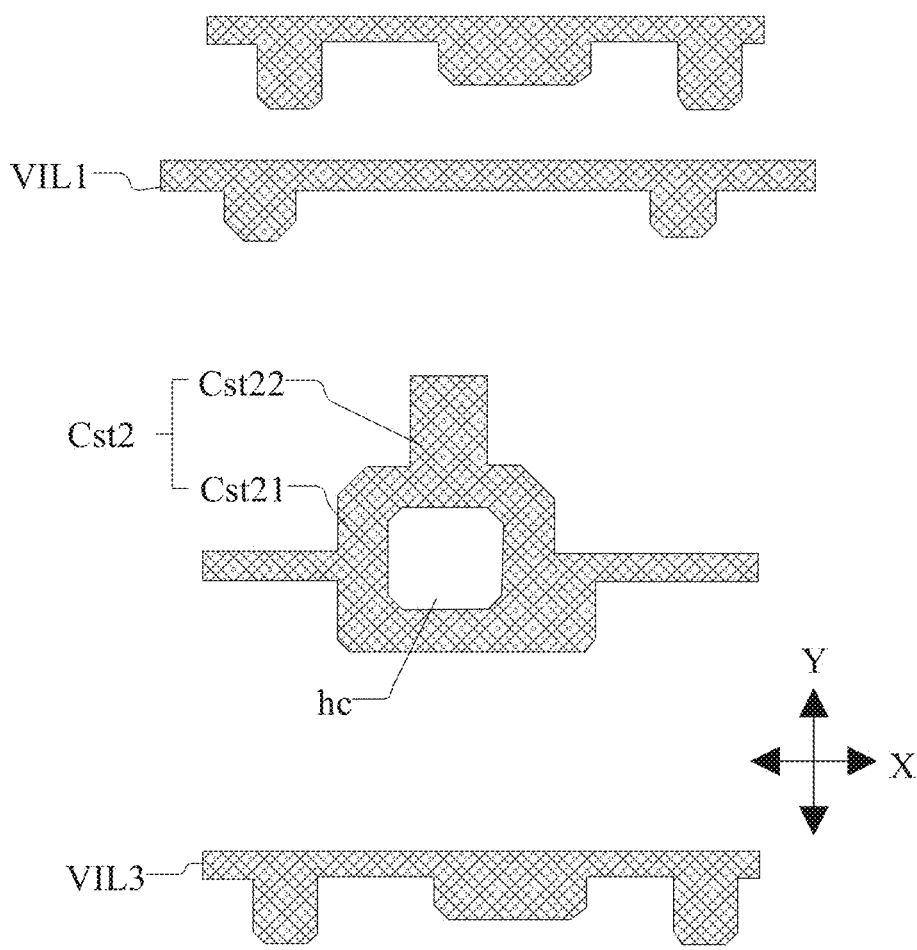
FIG. 17 is a partial top view of a second gate layer in FIG. 13.
Figure 18:
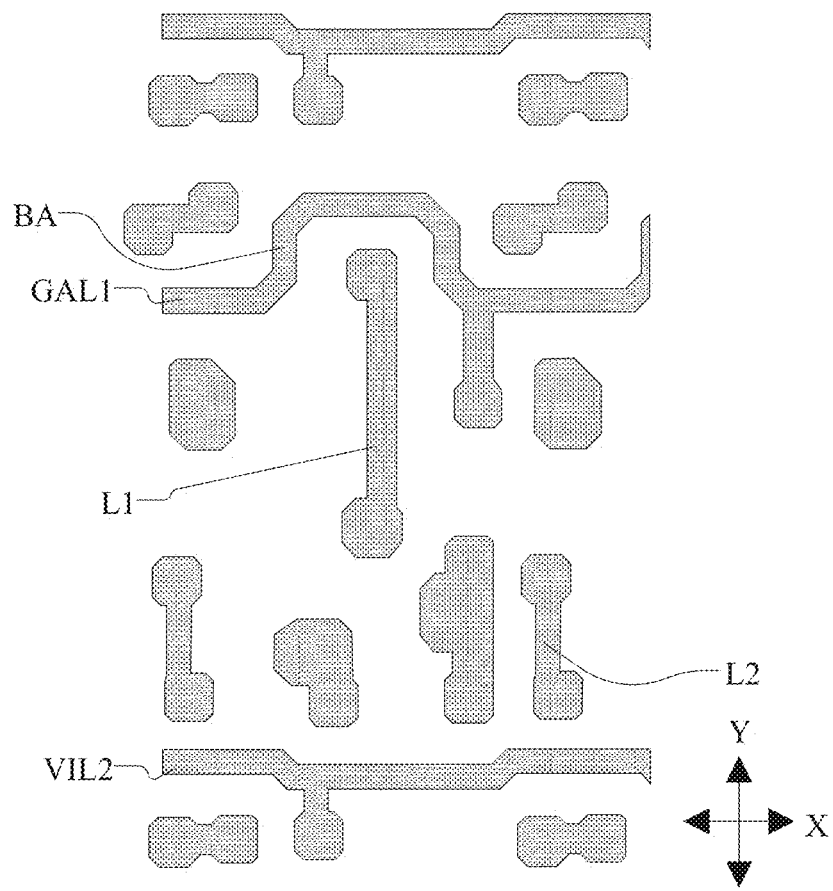
FIG. 18 is a partial top view of a first source and drain layer in FIG. 13.
Figure 19:
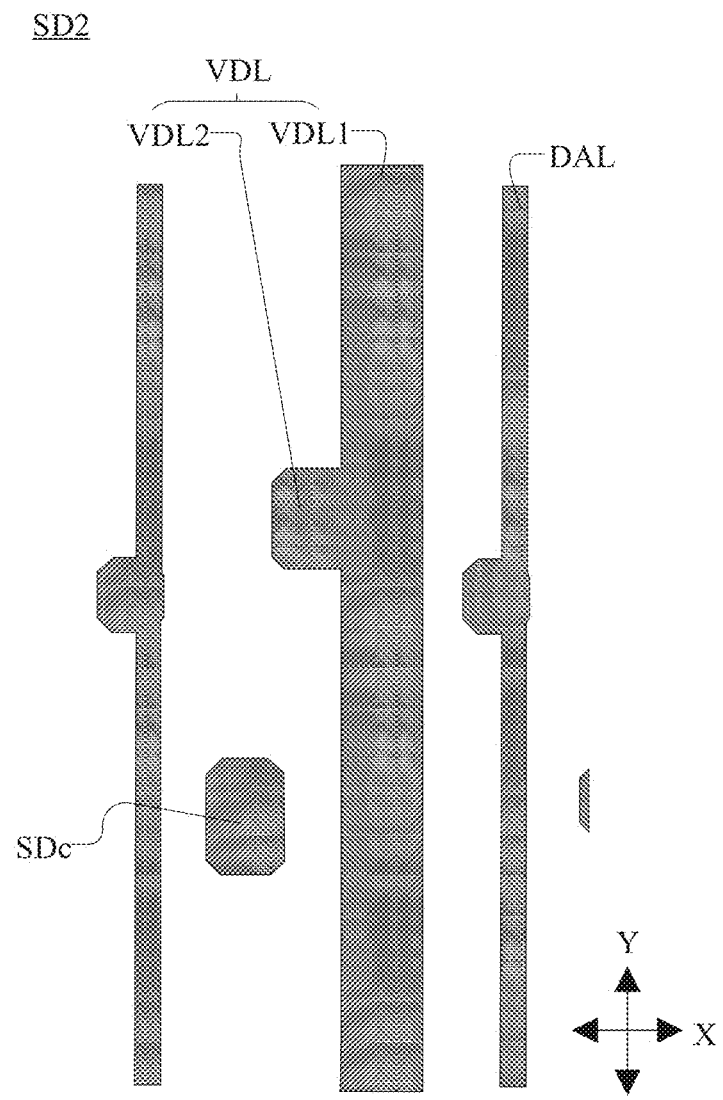
FIG. 19 is a partial top view of a second source and drain layer in FIG. 13.

In some embodiments, based on above second type of pixel circuit, as shown in FIGS. 4, 13 and 14, the compensation transistor T2 is connected to the control terminal and the second signal terminal of the driving transistor T3. A first signal terminal of the initialization transistor T8 is connected to the initialization signal line VIL3, and a second signal terminal of the initialization transistor T8 is connected to the second signal terminal of the writing transistor T4 at the first signal terminal of the driving transistor T3.

As shown in FIG. 3, the initialization transistor T8 and the writing transistor T4 can be turned on and turned off synchronously, that is, the initialization signal VI3 and the first reset signal VI1 can be input synchronously. In the reset phase t1, the control terminal and one signal terminal of the driving transistor T3 can be reset through the first reset signal VI1 and the initialization signal VI3, that is, the gate-source voltage difference of the driving transistor T3 can be reset, which facilitates reducing the impact on the current of the driving transistor T3 caused by the hysteresis effect of the driving transistor T3, thereby improving the residual images. In some embodiments, the initialization signal VI3 can also be unsynchronized with the first reset signal VI1, but the reset should be completed before the write phase t2.

In some embodiments, as shown in FIG. 3, when the display panel is displaying a screen, a display frame can be divided into multiple subframes, a first frame of the subframes is defined as a refresh frame, and the rest of the subframes are defined as hold frames. In the low frequency operation, for example, in the operation with a frequency less than 30 HZ, in order to save power consumption, the reset control signal, the second scan signal GA2 and the data signal can be not refreshed when the frame is held, but the initialization control signal, the light-emitting control signal, the first scan signal GA1 and the second reset control signal can be refreshed. The initialization signal VI3 (a constant potential) can be periodically applied to the source of the driving transistor to improve the residual image caused by hysteresis deviation. The first electrode ANO of the light-emitting device LD can also be periodically reset to improve the flicker at the low frequency.

It should be noted that for the first implementation described above, in the reset phase t1, the initialization signal VI3 is input at the second signal terminal of the driving transistor T3 and is output at the first signal terminal of the driving transistor T3, then the second signal terminal is the source and the first signal terminal is the drain. While in the light-emitting phase t3, the current is input at the first signal terminal of the driving transistor T3 and output at the second signal terminal thereof, then the first signal terminal is the source and the second signal terminal thereof is the drain.

For the second implementation, in the reset phase t1 and the light-emitting phase t3, the first signal terminal of the driving transistor T3 is the source and the second signal terminal thereof is the drain.

The driving backplane BP will be described in detail in the following, in conjunction with the layout of the pixel circuit.

The display effect or performance of the display panel can be improved by restricting the structure, the position, and the overlapping relationship, etc. of a portion of wirings and transistors. Specific technical means will be described in detail in the following.

As shown in FIGS. 1, 5, 6, 12, 13, 14 and 19, the data line DAL and the power line VDL can be arranged on a side of the pixel circuit away from the substrate SU, and both the data line DAL and the power line VDL extend along the column direction Y. The light irradiated to the channel of the compensation transistor T2 can be reduced by the shielding of the power line VDL. For example, the power line VDL can include a power line body VDL1 and a shielding part VDL2, the power line body VDL1 can extend along the column direction Y, and the shielding part VDL2 can be connected to a side of the power line body VDL1 along the row direction X. The shielding part VDL2 is a protrusion structure formed by outward protruding of the power line body VDL1, that is, the shielding part VDL2 and the power line body VDL1 can be an integrated structure. In other embodiments, the shielding part VDL2 and the power line body VDL1 can be separate but interconnected structures.

At least a portion of the writing transistor T4 and the initialization transistor T8 are located between the power line VDL and the data line DAL. At least a portion of the channel of the driving transistor T3 overlaps with the power line VDL. At least a portion of the channel of the compensation transistor T2 overlaps with the shielding part VDL2, so that at least a portion of the channel of the compensation transistor T2 can be shielded through the shielding part VDL2, to reduce the light irradiated to the channel of the compensation transistor T2, thereby reducing the risk of characteristic drift of the compensation transistor T2 and avoiding the specific drift from affecting the normal writing of data signals at the control terminal of the driving transistor T3. As a result, the brightness stability of the light-emitting device LD can be ensured.

A width of the shielding part VDL2 along the row direction X can be greater than 1.5 microns or 2 microns.

In some embodiments of the present disclosure, the compensation transistor T2 and the driving transistor T3 are arranged along the column direction Y, and the driving transistor T3 is located between the compensation transistor T2 and the initialization transistor T8.

Figure 7:
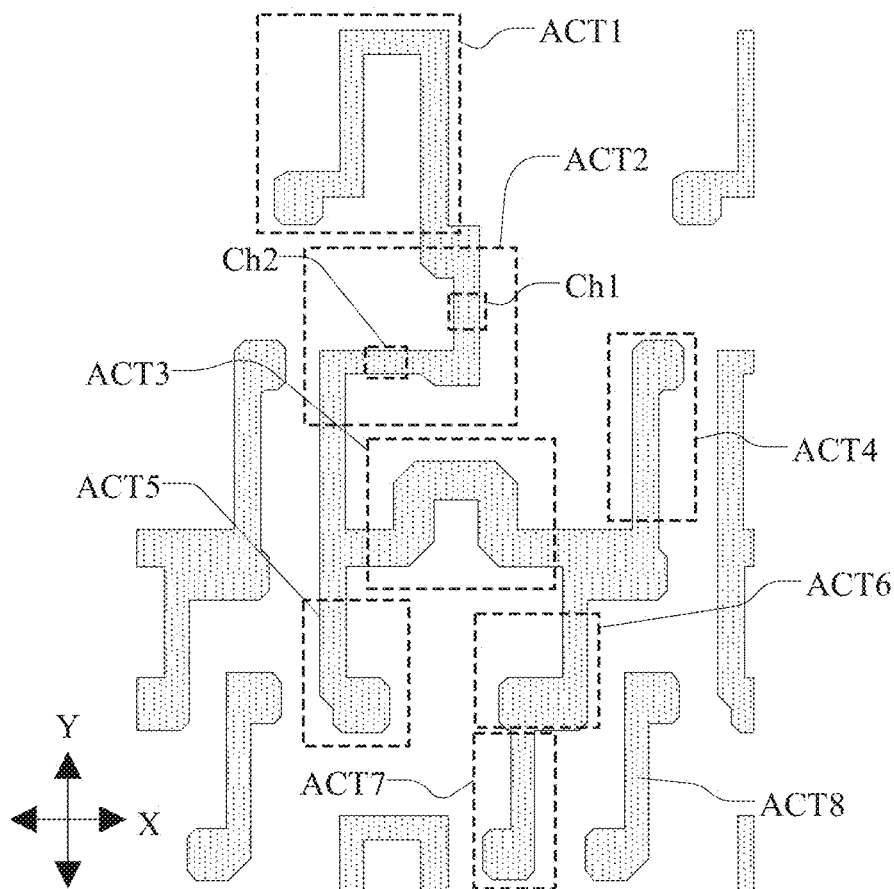
FIG. 7 is a partial top view of a semiconductor layer in FIG. 5.
Figure 8:
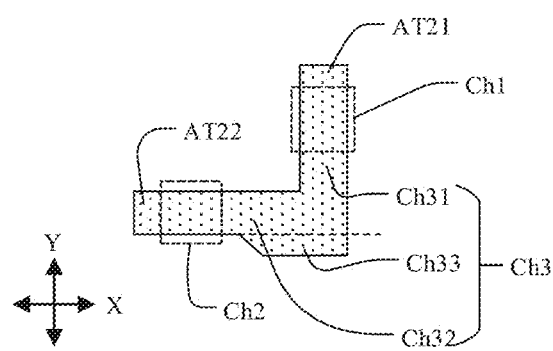
FIG. 8 is a partial enlarged view of a second active part in FIG. 7.
Figure 9:
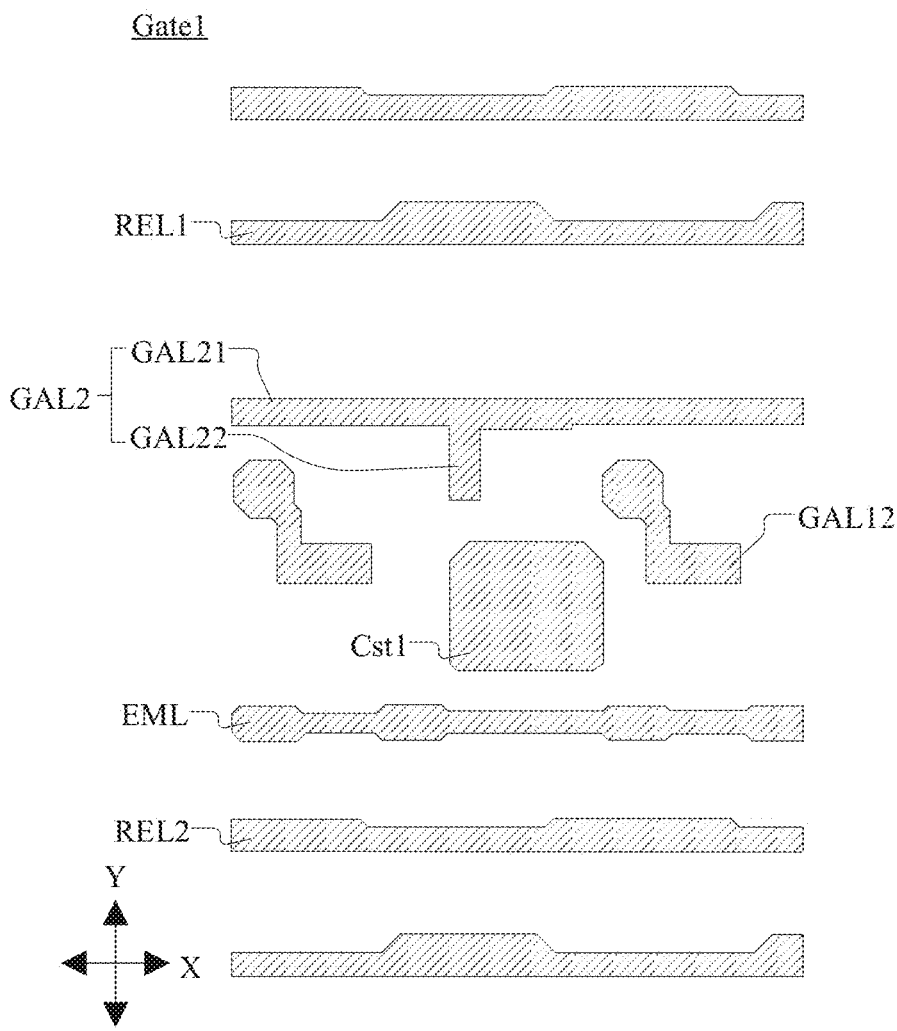
FIG. 9 is a partial top view of a first gate layer in FIG. 5.
Figure 10:
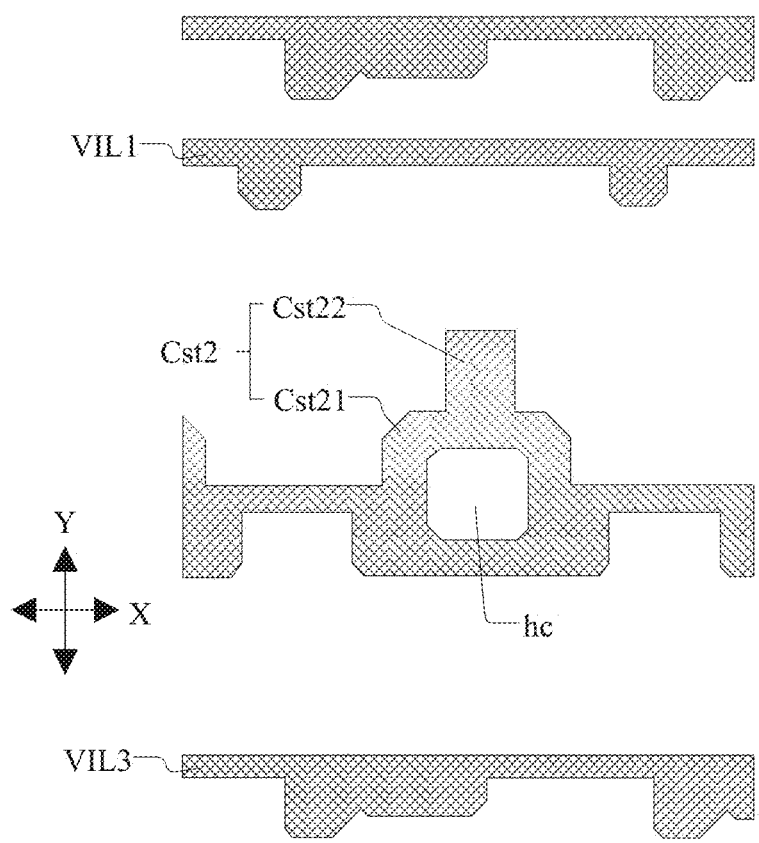
FIG. 10 is a partial top view of a second gate layer in FIG. 5.
Figure 11:
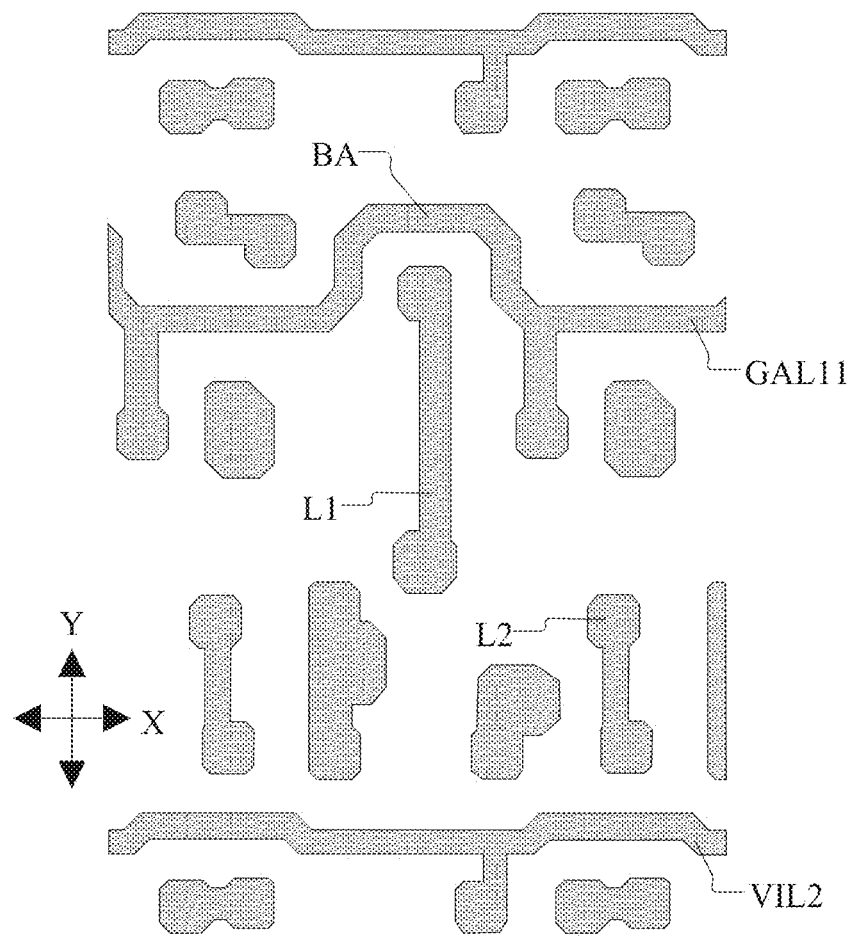
FIG. 11 is a partial top view of a first source and drain layer in FIG. 5.
Figure 12:
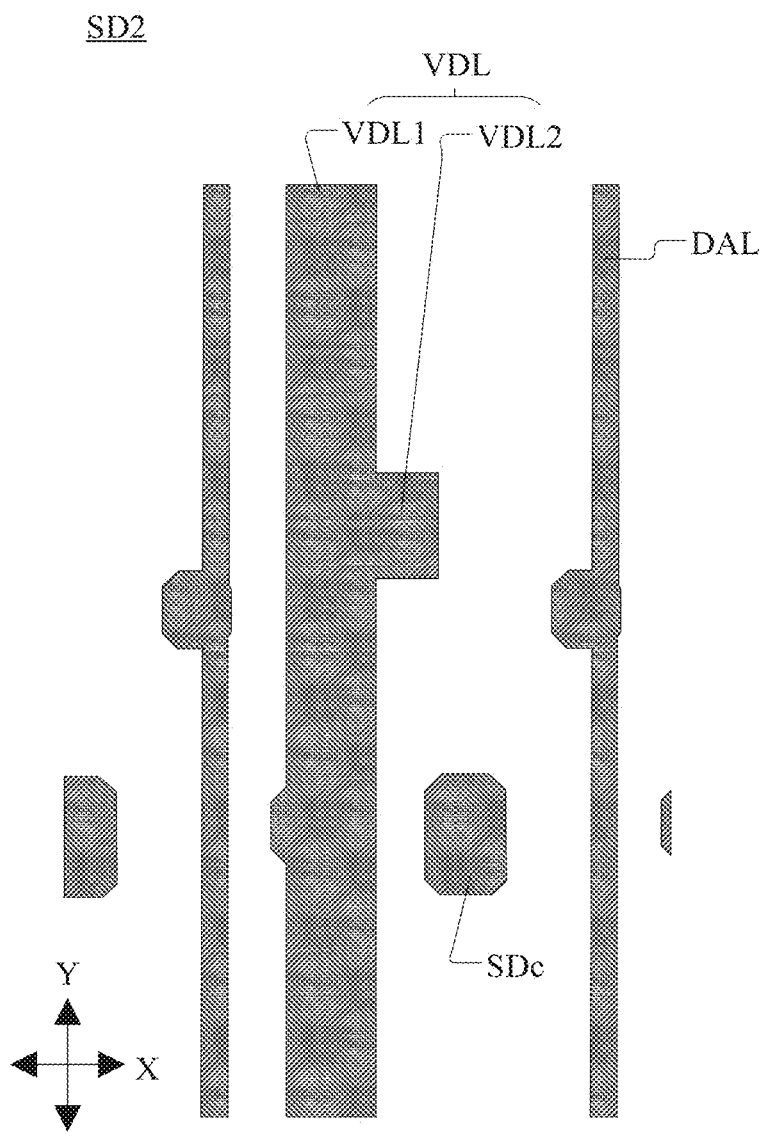
FIG. 12 is a partial top view of a second source and drain layer in FIG. 5.

As shown in FIGS. 6-8, the compensation transistor T2 can have multiple channels connected in series to reduce leakage, so as to facilitate ensuring the voltage stability of the control terminal of the driving transistor T3. For example, the compensation transistor T2 can include a first channel ch1, a second channel ch2, and an active connection part ch3 connecting the first channel ch1 and the second channel ch2. The first channel ch1 can be located on a side of the second channel ch2 away from the driving transistor T3, and on a side of the second channel ch2 close to the data line DAL. The shielding part VDL2 overlaps with at least a portion of the first channel ch1, so that the first channel ch1 is shielded and the light irradiated to the first channel ch1 is reduced. In order to shield the light to the maximum extent, an orthographic projection of the first channel ch1 on the substrate SU can be enabled to be located entirely within an orthographic projection of the shielding part VDL2 on the substrate SU.

In some embodiments, as shown in FIGS. 5 and 6, the second channel ch2 can also be shielded through the power line body VDL1. For example, the power line body VDL1 can be enabled to be located on a side of the shielding part VDL2 away from the data line DAL, and the power line body VDL1 overlaps with at least a portion of the second channel ch2. In some embodiments, the power line body VDL1 also overlaps with at least a portion of the channel of the first reset transistor T1, at least a portion of the channel of the driving transistor T3, and at least a portion of the channel of the first light-emitting control transistor T5.

In some embodiments of the present disclosure, as shown in FIG. 5, based on the compensation transistor T2 mentioned above, having a first channel ch1 and a second channel ch2, the storage capacitor Cst is located between the second channel ch2 and the initialization transistor T8, and overlaps with at least a portion of the channel of the driving transistor T3. The storage capacitor Cst can include a first plate Cst1 and a second plate Cst2 arranged in a spaced manner along a direction away from the substrate SU. To reduce the interference of external signals to the active connection part ch3 and to improve the screen flickering at low frequencies, the active connection part ch3 can be enabled to overlap with the storage capacitor Cst, so as to form a capacitor to shield the interference of external signals.

As shown in FIG. 8, the active connection part ch3 can include a first connection section ch31, a second connection section ch32, and a protrusion part ch33. The first connection section ch31 extends along the column direction Y. The second connection section ch32 extends along the row direction X. One end of the first connection section ch31 is connected to the first channel ch1, the other end of the first connection section ch31 is connected to one end of the second connection section ch32, and the other end of the second connection section ch32 is connected to the second channel. The first connection section ch31 and the first channel ch1 have the same width along the row direction X, and the second connection section ch32 and the second channel ch2 have the same width along the column direction Y. The first channel ch1 and the second channel ch2 can be connected through the first connection section ch31 and the second connection section ch32, so that the compensation transistor T2 can be a double-gate structure. The first plate Cst1 of the storage capacitor Cst overlaps with the channel of the driving transistor T3, and can be repeatedly used as the control terminal of the driving transistor T3. The second plate Cst2 of the storage capacitor Cst can overlaps with at least a portion of both the first connection section ch31 and the second connection section ch32, thereby producing a capacitor that can shield the external signal interference. The protrusion part ch33 can extend from the second connection section ch32 away from the first connection section ch31 along a direction away from the first connection section ch31, and at least a portion of the protrusion part ch33 overlaps with the storage capacitor Cst. The protrusion part ch33 can be regarded as an additional area extending from the second connection section ch32, which facilitates increasing an overlapped area between the active connection part ch3 and the storage capacitor Cst, thereby increasing the capacitor for shielding external signals and enhancing the shielding capability.

An area of an orthographic projection of the protrusion part ch33 on the substrate SU is not less than 10% of an area of orthographic projections of the first connection section ch31 and the second connection section ch32 on the substrate SU. That is, an area of the active connection part ch3 with the protrusion part ch33 can be increased by at least 10% compared to that without the protrusion part ch33.

In some embodiments, as shown in FIGS. 5 and 10, and FIGS. 13 and 17, the second plate Cst2 can include a plate body Cst21 and an extension part Cst22. The plate body Cst21 overlaps with the first plate Cst1, and is located between the second channel ch2 and the driving transistor T3. The extension part Cst22 can extend from an edge of the plate body Cst21 along a direction away from the driving transistor T3, and can be regarded as an additional protrusion portion of the plate body Cst21. The extension part Cst22 can overlap with at least a portion of the first connection section ch31, the second connection section ch32 and the protrusion part ch33, increasing a capacitor between the active connection part ch3 and the second plate Cst2 while avoiding an area of the second plate Cst2 being too large.

In some embodiments of the present disclosure, as shown in FIG. 5, the channel of the writing transistor T4 and the channel of the initialization transistor T8 are arranged along the column direction Y. The first light-emitting control transistor T5 and the second light-emitting control transistor T6 are arranged on a side of the initialization transistor T8 away from the data line DAL along the row direction X. An orthographic projection of the channel of the writing transistor T4 on the substrate SU and an orthographic projection of the data line DAL on the substrate SU, and an orthographic projection of the channel of the initialization transistor T8 on the substrate SU and an orthographic projection of the data line DAL on the substrate SU are distributed in a spaced manner. That is, the channel of the writing transistor T4 and the channel of the initialization transistor T8 do not overlap with the data line DAL.

In some embodiments of the present disclosure, as shown in FIGS. 5, 11, 13, and 18, the first scan line GAL1 can include a first scan line body GAL11 and a transfer connection part GAL12 insulatedly arranged along a direction away from the substrate SU. That is, the first scan line body GAL1I and the transfer connection part GAL12 are located in different film layers, and the transfer connection part GAL12 connects the first scan line body GAL11 to the control terminal of the writing transistor T4. By forming the first scan line GAL1 using the first scan line body GAL11 and the transfer connection part GAL12 located in different film layers, the space for designing a wiring path can be increased and the overlap with other lines can be minimized, thereby reducing parasitic capacitance, lowering the data signal load, and improving the display uniformity of the display panel.

A circuit layer CL of the driving backplane BP will be described in detail in conjunction with the pixel circuit of the 8T1C structure described above in the following.

As shown in FIG. 1, the circuit layer CL includes a semiconductor layer SEL, a first gate insulating layer GI1, a first gate layer GAT1, a second gate insulating layer GI2, a second gate layer GAT2, a dielectric layer ILD, a first source and drain layer SD1, a first flat layer PLN1, and a second source and drain layer SD2.

The semiconductor layer SEL can be provided on a side of the substrate SU. The semiconductor layer SEL includes the channel of each transistor, and a material of the semiconductor layer SEL can be low temperature polycrystalline silicon, etc.

The first gate insulating layer GI1 can cover the semiconductor layer SEL, and a material of the first gate insulating layer GI1 can be an insulating material such as silicon nitride, silicon oxide, etc.

The first gate layer GAT1 can be provided on a surface of the first gate insulating layer GI1 away from the substrate SU, and a material of the first gate layer GAT1 can be metal, some metal oxides or other conductive materials. The first gate layer GAT1 can include the initialization control line REL2, the light-emitting control line EML, the reset control line REL1, the second scan line GAL2, the transfer connection part GAL12 and the first plate Cst1 of the storage capacitor Cst as described above.

The second gate insulating layer GI2 can cover the first gate layer GAT1. A material of the second gate insulating layer GI2 can be an insulating material such as silicon nitride, silicon oxide, etc., and the material of the second gate insulating layer GI2 can be the same as the first gate insulating layer Gil.

The second gate layer GAT2 can be provided on a surface of the second gate insulating layer GI2 away from the substrate SU, and a material of the second gate layer GAT2 can be metal, some metal oxides or other conductive materials. The second gate layer GAT2 can include the initialization signal line VIL3, the first reset signal line VIL1 and the second plate Cst2 as described above.

The dielectric layer ILD can cover the second gate layer GAT2, and a material of the dielectric layer ILD can also be an insulating material such as silicon nitride, silicon oxide, etc.

The first source and drain layer SD1 is provided on a surface of the dielectric layer ILD away from the substrate SU, and a material of the first source and drain layer SD1 can be metal, some metal oxides or other conductive materials. The first source and drain layer SD1 can include a first scan line body GAL11 and a second reset signal line VIL2.

The first flat layer PLN1 is provided on a side of the first source and drain layer SD1 away from the substrate SU. A material of the first flat layer PLN1 can be resin or other organic materials. The material has fluidity before curing, which can be used to achieve leveling and then curing so that the surface away from the substrate SU is flat. The first flat layer PLN1 can directly cover the first source and drain layer SD1, or a passivation layer covering the first source and drain layer SD1 can be formed first, and then the first flat layer PLN1 is used to cover the passivation layer. A material of the passivation layer can be an insulating material such as silicon nitride, silicon oxide, etc.

The second source and drain layer SD2 can be provided on a surface of the first flat layer PLN1 away from the substrate SU, and a material of the second source and drain layer SD2 can be metal, some metal oxides or other conductive materials. The second source and drain layer SD2 includes the power line VDL and the data line DAL.

In some embodiments, as shown in FIGS. 5 and 13, the second source and drain layer SD2 can further include a source-drain transfer connection part SDc. The source-drain transfer connection part SDc and the data line DAL, and the source-drain transfer connection part SDc and the power line VDL are arranged in a spaced manner. The source-drain transfer connection part SDc can be connected to the second signal terminal of the second light-emitting control transistor T6, and the first electrode ANO of the light-emitting device LD can be connected to the source-drain transfer connection part SDc, so as to be connected to the second light-emitting control transistor T6 through the source-drain transfer connection part SDc. For the first type of pixel circuit, the source-drain transfer connection part SDc is located between the power line VDL and the data line DAL, and for the second type of pixel circuit, the power line VDL is located between the source-drain transfer connection part SDc and the data line DAL.

Positions of each of the transistors and the wirings will be described in detail in conjunction with a pattern of the semiconductor layer SEL in the following.

As shown in FIG. 7, the semiconductor layer SEL can include a first active part ACT1 to an eighth active part ACT8. In some embodiments, a first active part ACT1, a second active part ACT2, and a third active part ACT3 are arranged along the column direction Y and are connected in sequence. That is, the first active part ACT1 is connected to the second active part ACT2, and the second active part ACT2 is connected to the third active part ACT3. A fourth active part ACT4 is connected to a side of the third active part ACT3 close to the second active part ACT2, and is arranged with the second active part ACT2 along the row direction X. A fifth active part ACT5 and a sixth active part ACT6 are connected to a side of the third active part ACT3 away from the second active part ACT2, and the fifth active part ACT5 and the sixth active part ACT6 are arranged along the row direction X. A seventh active part ACT7 is connected to an end of the sixth active part ACT6 away from the third active part ACT3. An eighth active part ACT8 is arranged with the fourth active part ACT4 along the column direction Y, and is arranged with the seventh active part ACT7 along the row direction X.

As shown in FIGS. 5-7 and FIGS. 13-15, the first active part ACT1 can include the channel of the first reset transistor T1. The reset control line REL1 can extend along the row direction X and overlap with the channel of the first reset transistor T1, on the basis of which the first reset transistor T1 is formed. A region where the reset control line REL1 overlaps with the first reset transistor T1 is the control terminal of the first reset transistor T1, that is, the gate of the first reset transistor T1. The first reset signal line VIL1 can extend along the row direction X and overlap with the first active part ACT1. In some embodiments, in order to reduce the leakage, the first reset transistor T1 can also be a dual-gate structure, the first active part ACT1 can be a "U" shaped structure, and include a first channel part and a second channel part provided along the row direction X, and a connection part connecting the first and the second channel parts. The reset control line REL1 overlaps with the first channel part and the second channel part, so as to form the first reset transistor T1 with a double-gate structure. One of the first channel part and the second channel part is connected to the second active part ACT2, and the other is used to be connected to the first reset signal line VIL1, for receiving the first reset signal VI1.

The second active part ACT2 can include the first channel ch1, the second channel ch2, and the active connection part ch3. The second scan line GAL2 includes a second scan line body GAL21 extending along the row direction X and an overlapping part GAL22 connected to a side of the second scan line body GAL21. The second scan line body GAL21 overlaps with the first channel ch1, and the overlapping part GAL22 overlaps with the second channel ch2. An area where the second scan line GAL2 overlaps with the second active part ACT2 is the control terminal, i.e., the gate, of the compensation transistor T2, thereby forming the compensation transistor T2 with a double-gate structure.

The third active part ACT3 can include the channel of the driving transistor T3, and the channel can be a U-shaped structure bent toward the first active part ACT1. The first plate Cst1 of the storage capacitor Cst overlaps with the channel, serving both as the control terminal, i.e., the gate, of the driving transistor T3 and as one plate of the storage capacitor Cst.

The fourth active part ACT4 can include the channel of the writing transistor T4. The transfer connection part GAL12 of the first scan line GAL1 can overlap with the channel of the writing transistor T4, and an area where the transfer connection part GAL12 overlaps with the fourth active part ACT4 is the control terminal, i.e., the gate, of the writing transistor T4. The data line DAL can be connected to an end of the fourth active part ACT4 away from the third active part ACT3, for inputting the data signal.

The fifth active part ACT5 can include the channel of the first light-emitting control transistor T5, and the sixth active part ACT6 includes a channel of the second light-emitting control transistor T6. The light-emitting control line EML can extend along the row direction X, and overlap with the channels of the first light-emitting control transistor T5 and the second light-emitting control transistor T6, on the basis of which the first light-emitting control transistor T5 and the second light-emitting control transistor T6 are formed. An area where the light-emitting control line EML overlaps with the fifth active part ACT5 is the control terminal, i.e., the gate, of the first light-emitting control transistor T5, and an area where the light-emitting control line EML overlaps with the sixth active part ACT6 is the control terminal, i.e., the gate, of the second light-emitting control transistor T6.

The seventh active part ACT7 can include a channel of the second reset transistor T7, and the eighth active part ACT8 can include a channel of the initialization transistor T8. The initialization control line REL2 can extend along the row direction X, and overlap with the channels of the second reset transistor T7 and the initialization transistor T8, on the basis of which the second reset transistor T7 and the initialization transistor T8 are formed. An area where the initialization control line REL2 overlaps with the eighth active part ACT8 is the control terminal, i.e., the gate, of the initialization transistor T8, and an area where the initialization control line REL2 overlaps with the seventh active part ACT7 is the control terminal, i.e., the gate, of the second reset transistor T7. In some embodiments, both the initialization signal line VIL3 and the second reset signal line VIL2 extend along the row direction X, and both overlap with the seventh active part ACT7 and the eighth active part ACT8.

As shown in FIGS. 5 and 13, the reset control line REL1, the second scan line GAL2, and the initialization control line REL2 can be arranged in a spaced manner along the column direction Y. The first scan line body GAL11 is located between the reset control line REL1 and the second scan line GAL2, and is located on a side of the second scan line body GAL21 away from the driving transistor T3. The first reset signal line VIL1 is located between the reset control line REL1 and the first scan line body GAL11. The third active part ACT3 is located between the second scan line GAL2 and the initialization control line REL2. Accordingly, the first plate Cst1 and the second plate Cst2 of the storage capacitor Cst are located between the second scan line GAL2 and the initialization control line REL2, and the second plates Cst2 of two adjacent columns of storage capacitors Cst can be connected to each other, to reduce the resistance after being connected to the power line VDL. The second reset signal line VIL2 partially overlaps with the initialization control line REL2, and is partially located on a side of the initialization control line REL2 away from the reset control line REL1. The initialization signal line VIL3 is at least partially located on a side of the second reset signal line VIL2 away from the reset control line REL1.

The first source and drain layer SD1 can include multiple connection lines. The first reset signal line VIL1 can be connected to a channel part of the first active part ACT1 through a connection line, for inputting the first reset signal VI1 to the first reset transistor T1. The initialization signal line VIL3 can be connected to the eighth active part ACT8 through a connection line, for inputting the initialization signal VI3 to the initialization transistor T8.

In some embodiments of the present disclosure, as shown in FIG. 8, the second active part ACT2 can include a first active section ACT21 extending along the column direction Y and a second active section ACT22 extending along the row direction X. The active connection part ch3 connects the first active section ACT21 to the second active section ACT22, with the first channel ch1 located in the first active section ACT21 and the second channel ch2 located in the second active section ACT22. In some embodiments, the first scan line body GAL11 has a bending area BA bent along a direction away from the driving transistor T3. One end of the first active section ACT21 extends to a side of the second scan line body GAL21 away from the driving transistor T3, and an orthographic projection of this end on the substrate SU extends into an orthographic projection of the bending area BA on the substrate SU, but the two do not overlap with each other. That is, the bending area BA can avoid the end of the first active section ACT21 extending to the side of the second scan line body GAL21 away from the driving transistor T3.

As shown in FIGS. 5 and 11 and FIGS. 13 and 18, the connection line of the first source and drain layer SD1 can include a first connection line L1. The first connection line L1 can extend along the column direction Y. One end of the first connection line L1 can be connected to the end of the first active section ACT21 located within the bending area BA, and the other end of the first connection line L1 passes through a through hole 'hc' provided in the second plate Cst2 and is connected to the first plate Cst1, but not connected to the second plate Cst2.

In some embodiments of the present disclosure, the eighth active part ACT8 can extend along the column direction Y, and both ends of the eighth active part ACT8 extend to both sides of the initialization control line REL2. The connection line of the first source and drain layer SD1 can further include a second connection line L2. The second connection line L2 can extend along the column direction Y, one end of the second connection line L2 is connected to an end of the eighth active part ACT8 located where the initialization control line REL2 is close to the driving transistor T3, and the other end of the second connection line L2 is connected to the third active part ACT3 and the fourth active part ACT4.

In some embodiments, the second connection line L2 can extend along the column direction Y, and the channel of the writing transistor T4, the channel of the initialization transistor T8 and the second connection line L2 can be distributed along the column direction Y. An orthographic projection of the second connection line L2 on the substrate SU and an orthographic projection of the data line DAL on the substrate SU are distributed in a spaced manner. The second connection line L2 and the data line DAL do not overlap to prevent the generation of the parasitic capacitance between the data line DAL and the connection line L2, which facilitates reducing the load of the data signal DA of the data line DAL.

In some embodiments, in order to facilitate the arrangement of the light-emitting device LD, the driving backplane BP can further include a second flat layer PLN2 covering the second source and drain layer SD2. A material of the second flat layer PLN2 can be resin or other organic materials. A surface of the second flat layer PLN2 away from the substrate SU is flat, and the first electrode ANO of the light-emitting device LD can be arranged on the surface of the second flat layer PLN2 away from the substrate SU.

It should be noted that the connection of the structures located in two different film layers herein can be achieved through contact holes. For example, the first connection line L1 can be connected to the first active part ACT1 through contact holes penetrating the dielectric layer ILD, the second gate insulating layer GI2 and the first gate insulating layer GI1, and can be connected to the first plate Cst1 through contact holes penetrating the dielectric layer ILD and the second gate insulating layer GI2. The connection through the contact holes will not be described in detail herein.

Embodiments of the present disclosure provide a display panel. The display panel can include a driving backplane and a light-emitting device LD.

The driving backplane BP can be any driving backplane BP in above embodiments, the structure of which will not be described in detail herein.

The light-emitting device LD can be provided on a side of the circuit layer CL away from the substrate SU, and is connected to the pixel circuit. The number of the light-emitting devices LD can be multiple, and each of the light-emitting devices LD can be connected to a pixel circuit. The same pixel circuit can be connected to one or more light-emitting devices LD. The light-emitting device LD can be OLED (organic light-emitting diode), QLED (quantum dot light-emitting diode), Micro LED or Mini LED, etc., and can include the first electrode ANO, the second electrode CAT and the light-emitting layer EL located between the first electrode ANO and the second electrode CAT.

In the case of an OLED, for example, the first electrode ANO can be provided on a surface of the circuit layer CL away from the substrate SU, for example, a surface of the second flat layer PLN2 away from the substrate SU. The light-emitting layer EL can include a hole injection layer, a hole transport layer, a light-emitting material layer, an electron transport layer, and an electron injection layer stacked along a direction away from the driving backplane BP. Each of the light-emitting devices LD can share the second electrode CAT. That is, the second electrode CAT can be a continuous whole-layer structure, and the second electrode CAT can extend to the peripheral area and can receive the second power supply signal VSS. The first electrode ANO is distributed in an array to ensure that each light-emitting device LD can emit light independently. In some embodiments, in order to limit a light-emitting range of the light-emitting device LD and to prevent crosstalk, a pixel definition layer PDL can be provided on a surface of the first electrode ANO. The pixel definition layer PDL can be provided with an opening that exposes each first electrode ANO, and the light-emitting layer EL and the first electrode ANO are stacked in the opening.

Each of the light-emitting devices LD can share at least the light-emitting material layer, so that a light-emitting color of each light-emitting device LD is the same. In some embodiments, in order to realize color display, a color film layer can be provided on a side of the light-emitting device LD away from the substrate SU. The color display is realized through a filter section corresponding to each light-emitting device LD in the color film layer. In some embodiments, the light-emitting material layer of each light-emitting device LD can also be independent, so that the light-emitting device LD can directly emit monochromatic light. The light-emitting colors of different light-emitting devices LD can be different, so as to realize the color display.

In some embodiments, the display panel can further include an encapsulation layer covering each light-emitting device LD, and can further include a touch layer, a transparent cover, and other film layers provided on a side of the encapsulation layer away from the substrate SU, which will not be described in detail herein.

Embodiments of the present disclosure also provide a display device. The display device can include the display panel in any embodiments mentioned above. The display panel is any display panel in above embodiments, and the specific structure and beneficial effects of which can be referred to above implementations of the display panel, which will not be described herein. The display device of the present disclosure can be a cell phone, a tablet PC, a TV and other electronic devices with display functions, which will not be enumerated herein.

After considering the specification and practices of the invention disclosed herein, those skilled in the art will easily come up with other implementation solutions of the present disclosure. The present disclosure aims to cover any variations, uses, or adaptive changes of the present disclosure, which follow the general principles of the present disclosure and include common knowledge or commonly used technical means in the art that are not disclosed in the present disclosure. The specification and embodiments are only considered exemplary, and the true scope and spirit of the present disclosure are defined by appended claims.

What is claimed is:

1. A driving backplane having a pixel circuit, and a data line and a power line connected to the pixel circuit, wherein the pixel circuit comprises multiple transistors having a control terminal and two signal terminals, the transistors comprises at least a driving transistor, a writing transistor, a compensation transistor and an initialization transistor, one of the signal terminals of the driving transistor is connected to the power line, the other of the signal terminals of the driving transistor is connected to a light-emitting device, one of the signal terminals of the driving transistor is connected to the control terminal of the driving transistor through the compensation transistor, and the initialization transistor and the writing transistor are connected to the driving transistor at one same signal terminal different from a signal terminal at which the compensation transistor is connected to the driving transistor; and wherein the driving backplane comprises:
a substrate; and
a circuit layer arranged on a side of the substrate and comprising the pixel circuitry, the data line and the power line, wherein the data line and the power line are arranged on a side of the pixel circuitry away from the substrate, the data line and the power line extend along a column direction, and the power line comprises a power line body extending along the column direction and a shielding part connected to a side of the power line body along a row direction;
wherein at least a portion of the writing transistor and the initialization transistor are located between the power line and the data line, at least a portion of a channel of the driving transistor overlaps with the power line, and at least a portion of a channel of the compensation transistor overlaps with the shielding part.

2. The driving backplane according to claim 1,
wherein the compensation transistor and the driving transistor are arranged along the column direction, and the driving transistor is located between the compensation transistor and the initialization transistor; and
wherein the compensation transistor comprises a first channel, a second channel and an active connection part connecting the first channel and the second channel, the first channel is located on a side of the second channel away from the driving transistor and is located on a side of the second channel close to the data line, and the shielding part overlaps with at least a portion of the first channel.

3. The driving backplane according to claim 2, wherein the power line body is located on a side of the shielding part away from the data line, and the power line body overlaps with at least a portion of the second channel.

4. The driving backplane according to claim 2,
wherein the pixel circuit further comprises a storage capacitor located between the second channel and the initialization transistor, the storage capacitor is connected to the power line and the control terminal of the driving transistor, and the storage capacitor overlaps with at least a portion of the channel of the driving transistor; and
wherein the active connection part comprises a first connection section extending along the column direction, a second connection section extending along the row direction and a protrusion part, one end of the first connection section is connected to the first channel, the other end of the first connection section is connected to one end of the second connection section, the other end of the second connection section is connected to the second channel, the first connection section and the first channel have the same width along the row direction, and the second connection section and the second channel have the same width along the column direction; and
wherein the protrusion part extends from the second connection section away from the first connection section along a direction away from the first connection section, and at least a portion of the first connection section, the second connection section and the protrusion part all overlap with the storage capacitor.

5. The driving backplane according to claim 4, wherein the storage capacitor comprises a first plate and a second plate arranged along a direction away from the substrate, the first plate is repeatedly used as the control terminal of the driving transistor, and the second plate overlaps with at least a portion of the first connection section, the second connection section and the protrusion part.

6. The driving backplane according to claim 5, wherein the second plate comprises a plate body and an extension part, the plate body overlaps with the first plate, the plate body is located between the second channel and the driving transistor, the extension part extends from an edge of the plate body along a direction away from the driving transistor, and the extension part overlaps with at least a portion of the first connection section, the second connection section and the protrusion part.

7. The driving backplane according to claim 6,
wherein the circuit layer further comprises an initialization control line, an initialization signal line, a reset control line, a first reset signal line, a second reset signal line, a first scan line, a second scan line, and a light-emitting control line, and the pixel circuit further comprises a first light-emitting control transistor, a second light-emitting control transistor, a first reset transistor and a second reset transistor; and
wherein the power line is connected to one of the signal terminals of the driving transistor through the first light-emitting control transistor, the second reset transistor and the light-emitting device are connected to the driving transistor through the second light-emitting control transistor, and control terminals of the first light-emitting control transistor and the second light-emitting control transistor are both connected to the light-emitting control line; and
wherein the initialization signal line is connected to one of the signal terminals of the driving transistor through the initialization transistor, and control terminals of the initialization transistor and the second reset transistor are both connected to the initialization control line; and
wherein the first reset signal line is connected to the control terminal of the driving transistor through the first reset transistor, the reset control line is connected to a control terminal of the first reset transistor, the second reset signal line is connected to the second light-emitting control transistor and the light-emitting device through the second reset transistor, the first scan line is connected to a control terminal of the writing transistor, and the second scan line is connected to a control terminal of the compensation transistor.

8. The driving backplane according to claim 7, wherein the first scan line comprises a first scan line body and a transfer connection part insulatedly arranged along a direction away from the substrate, and the transfer connection part connects the first scan line body to the control terminal of the writing transistor.

9. The driving backplane according to claim 7, wherein the power line body overlaps with at least a portion of a channel of the first reset transistor, at least a portion of the channel of the driving transistor, and at least a portion of a channel of the first light-emitting control transistor.

10. The driving backplane according to claim 8, wherein the circuit layer comprises:
a semiconductor layer arranged on a side of the substrate and comprising channels of the transistors;
a first gate insulating layer covering the semiconductor layer;
a first gate layer arranged on a surface of the first gate insulating layer away from the substrate and comprising the initialization control line, the light-emitting control line, the reset control line, the second scan line, the transfer connection part and the first plate;
a second gate insulating layer covering the first gate layer;

a second gate layer arranged on a surface of the second gate insulating layer away from the substrate and comprising the initialization signal line, the first reset signal line and the second plate;

a dielectric layer covering the second gate layer;

a first source and drain layer arranged on a surface of the dielectric layer away from the substrate and comprising the first scan line body and the second reset signal line;

a first flat layer arranged on a side of the first source and drain layer away from the substrate; and a second source and drain layer arranged on a surface of the first flat layer away from the substrate and comprising the power line and the data line.

11. The driving backplane according to claim 10, wherein the semiconductor layer comprises multiple active parts, a first active part, a second active part and a third active part are arranged along the column direction and are connected in sequence, a fourth active part is connected to a side of the third active part close to the second active part, the fourth active part and the second active part are arranged along the row direction, a fifth active part and a sixth active part are connected on a side of the third active part away from the second active part, the fifth active part and the sixth active part are arranged along the row direction, a seventh active part is connected to an end of the sixth active part away from the third active part, an eighth active part and the fourth active part are arranged along the column direction, and the eighth active part and the seventh active part are arranged along the row direction; and wherein the first active part comprises a channel of the first reset transistor, the reset control line extends along the row direction and overlaps with the channel of the first reset transistor, and the first reset signal line extends along the row direction and overlaps with the first active part; and wherein the second active part comprises the first channel, the second channel and the active connection part, the second scan line comprises a second scan line body extending along the row direction and an overlapping part connected to a side of the second scan line body, the second scan line body overlaps with the first channel, and the overlapping part overlaps with the second channel; and wherein the third active part comprises the channel of the driving transistor; and wherein the fourth active part comprises a channel of the writing transistor, and the transfer connection part overlaps with the channel of the writing transistor; and wherein the fifth active part comprises a channel of the first light-emitting control transistor, the sixth active part comprises a channel of the second light-emitting control transistor, the light-emitting control line extends along the row direction and overlaps with the channels of the first light-emitting control transistor and the second light-emitting control transistor; and wherein the seventh active part comprises a channel of the second reset transistor, the eighth active part comprises a channel of the initialization transistor, the initialization control line extends along the row direction and overlaps with the channels of the second reset transistor and the initialization transistor, the initialization signal line and the second reset signal line both extend along the row direction, and both overlap with the seventh active part and the eighth active part.

12. The driving backplane according to claim 11, wherein the first scan line body is located on a side of the second scan line body away from the driving transistor; and wherein the second active part comprises a first active section extending along the column direction and a second active section extending along the row direction, the active connection part connects the first active section to the second active section, the first channel is located in the first active section, and the second channel is located in the second active section; and wherein the first scan line body has a bending area bent along a direction away from the driving transistor, and one end of the first active section extends to a side of the second scan line body away from the driving transistor; and wherein an orthographic projection of the end of the first active section extending to the side of the second scan line body away from the driving transistor on the substrate extends into an orthographic projection of the bending area on the substrate; and wherein the first source and drain layer further comprises a first connection line, one end of the first connection line is connected to the end of the first active section located within the bending area, and the other end of the first connection line passes through a through hole in the second plate and is connected to the first plate.

13. The driving backplane according to claim 11, wherein the eighth active part extends along the column direction, and both ends of the eighth active part extend to both sides of the initialization control line; and wherein the first source and drain layer further comprises a second connection line, one end of the second connection line is connected to an end of the eighth active part located where the initialization control line is close to the driving transistor, and the other end of the second connection line is connected to the third active part and the fourth active part.

14. The driving backplane according to claim 13, wherein the second connection line extends along the column direction, the channel of the writing transistor, the channel of the initialization transistor, and the second connection line are arranged along the column direction, and an orthographic projection of the second connection line on the substrate and an orthographic projection of the data line on the substrate are distributed in a spaced manner.

15. A display panel, comprising:
the driving backplane according to claim 1; and
a light-emitting device arranged on a side of the circuit layer away from the substrate and connected to the pixel circuit.

16. A display device comprising the display panel according to claim 15.

17. The driving backplane according to claim 1, wherein a width of the shielding part along the row direction is greater than 1.5 microns or 2 microns.

18. The driving backplane according to claim 2, wherein an orthographic projection of the first channel on the substrate is located entirely within an orthographic projection of the shielding part on the substrate.

* * * * *